United States Patent
Tamura et al.

(10) Patent No.: US 10,647,117 B2
(45) Date of Patent: May 12, 2020

(54) PIEZOELECTRIC DEVICE, LIQUID DISCHARGING HEAD, AND LIQUID DISCHARGING APPARATUS

(71) Applicant: SEIKO EPSON CORPORATION, Tokyo (JP)

(72) Inventors: Hiroaki Tamura, Shimosuwa (JP); Sayaka Yamasaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/988,992

(22) Filed: May 24, 2018

(65) Prior Publication Data

US 2018/0339516 A1  Nov. 29, 2018

(30) Foreign Application Priority Data

May 29, 2017  (JP) .................. 2017-105593

(51) Int. Cl.
*B41J 2/14* (2006.01)
*H01L 41/09* (2006.01)
*H01L 41/04* (2006.01)

(52) U.S. Cl.
CPC ....... *B41J 2/14274* (2013.01); *B41J 2/14233* (2013.01); *H01L 41/04* (2013.01); *H01L 41/0973* (2013.01)

(58) Field of Classification Search
None
See application file for complete search history.

(56) References Cited

U.S. PATENT DOCUMENTS

| 2005/0168536 | A1* | 8/2005 | Katayama | ............ B41J 2/14209 347/70 |
| 2007/0126805 | A1* | 6/2007 | Oya | ..................... B41J 2/14314 347/71 |
| 2009/0289998 | A1* | 11/2009 | Tanaka | ................. B41J 2/14233 347/68 |
| 2011/0007117 | A1 | 1/2011 | Bibl et al. | |
| 2016/0185114 | A1 | 6/2016 | Bibl et al. | |

FOREIGN PATENT DOCUMENTS

JP    2012-532772 A    12/2012
WO    WO2011/5699 A    1/2011

* cited by examiner

*Primary Examiner* — Erica S Lin
(74) *Attorney, Agent, or Firm* — Workman Nydegger

(57) ABSTRACT

There is provided a piezoelectric device including a pressure chamber, a piezoelectric element, and a diaphragm disposed between the pressure chamber and the piezoelectric element. The piezoelectric element is disposed on the diaphragm so as to overlap an inner periphery of the pressure chamber in plan view, and has an inner edge on a center side of the pressure chamber with the inner periphery of the pressure chamber being sandwiched within the piezoelectric element in plan view. A shape of the inner edge of the piezoelectric element is such that in the smallest first rectangle, which includes the inner edge in plan view.

15 Claims, 10 Drawing Sheets

PIEZOELECTRIC DEVICE, LIQUID DISCHARGING HEAD, AND LIQUID DISCHARGING APPARATUS

The entire disclosure of Japanese Patent Application No. 2017-105593, filed May 29, 2017, is expressly incorporated by reference herein.

BACKGROUND

1. Technical Field

The present invention relates to a technique in which a piezoelectric device causes a pressure change.

2. Related Art

A liquid discharging head that discharges, from nozzles, a liquid such as an ink supplied to a pressure chamber by a piezoelectric device causing a pressure change in the pressure chamber is proposed in the related art. For example, a technique, in which a piezoelectric device including a diaphragm (membrane) configuring a wall surface (top surface) of a pressure chamber (pumping chamber) and a piezoelectric element vibrating the diaphragm is provided for each pressure chamber, is disclosed in JP-T-2012-532772. The piezoelectric element is disposed on a peripheral portion of the circular pressure chamber, and the diaphragm is deformed to a pressure chamber side by the piezoelectric element deflecting the periphery of a vibration region of the diaphragm configured of a single-layer silicon base, which overlaps the pressure chamber in plan view.

However, since the diaphragm of JP-T-2012-532772 is configured of the single-layer silicon base, a Young's modulus of a crystal plane of the silicon base to be used changes according to a direction in the crystal plane in some cases. Since the diaphragm is more unlikely to deflect, for example, in a crystal orientation in which a Young's modulus is high than in a crystal orientation in which a Young's modulus is low in a case where the diaphragm is configured of such a silicon base, there is a possibility that the displacement of the diaphragm is inhibited as a whole. On the other hand, since the diaphragm is likely to deflect in the crystal orientation in which a Young's modulus is low, a crack is likely to be generated in the diaphragm or the piezoelectric element when the diaphragm deflects excessively. However, since a crystal orientation is not considered in the shapes of the pressure chamber and the piezoelectric element of JP-T-2012-532772, there is a possibility that the displacement of the diaphragm is inhibited as a whole or a crack is likely to be generated if there is an orientation in which a Young's modulus varies on the periphery of the diaphragm.

SUMMARY

An advantage of some aspects of the invention is to improve displacement efficiency while suppressing the generation of a crack.

According to an aspect of the invention, there is provided a piezoelectric device including a pressure chamber, a piezoelectric element, and a diaphragm disposed between the pressure chamber and the piezoelectric element. The diaphragm has a crystal plane {100} of a single crystal silicon base. The piezoelectric element is disposed on the diaphragm so as to overlap an inner periphery of the pressure chamber in plan view, and has an inner edge on a center side of the pressure chamber with the inner periphery of the pressure chamber being sandwiched within the piezoelectric element in plan view. A shape of the inner edge of the piezoelectric element is such that in the smallest first rectangle, which includes the inner edge in plan view, the inner edge is on the inside of each of sides at a middle portion of each of the sides of the first rectangle. A shape of the inner periphery of the pressure chamber is such that in the smallest second rectangle, which includes the inner periphery in plan view, the inner periphery is on the inside of each of sides at a middle portion of each of the sides of the second rectangle. A direction of one side out of the first rectangle and the second rectangle lies along a crystal orientation <010> in the crystal plane. According to this configuration, in a case where the diaphragm has the crystal plane {100} of the single crystal silicon base, the shape of the inner edge of the piezoelectric element and the shape of the inner periphery of the pressure chamber, which defines a vibration region of the diaphragm, are shapes according to a value of the Young's modulus of the diaphragm, which varies according to a crystal orientation. For this reason, a strain that occurs in the vibration region of the diaphragm can be uniformized in a peripheral direction. Accordingly, since an excessive deflection of the diaphragm in an orientation in which a Young's modulus is low can be suppressed, the generation of a crack in the diaphragm or the piezoelectric element can be suppressed. On the other hand, since the diaphragm is likely to deflect in an orientation in which a Young's modulus is high, the inhibition of displacement of the entire diaphragm can be suppressed. Therefore, displacement efficiency can be improved while the generation of a crack is suppressed.

In the piezoelectric device, in the middle portion of each of the sides of the first rectangle, a distance between the inner edge of the piezoelectric element and the side of the first rectangle in a first direction may be 0.79 times or more and 1 time or less with respect to a distance between the inner edge of the piezoelectric element and the side of the first rectangle in a second direction orthogonal to the first direction. In the middle portion of each of the sides of the second rectangle, a distance between the inner periphery of the pressure chamber and the side of the second rectangle in the first direction may be 0.79 times or more and 1 time or less with respect to a distance between the inner periphery of the pressure chamber and the side of the second rectangle in the second direction. According to this configuration, in a case where the diaphragm is configured of the crystal plane {100} of the single crystal silicon base, a certain degree of margin (for example, approximately ±35 degrees) can be ensured for a plane orientation offset angle of the single crystal silicon base. Also in this range, displacement efficiency can be improved while the generation of a crack in the diaphragm or the piezoelectric element is suppressed.

According to another aspect of the invention, there is provided a piezoelectric device including a pressure chamber, a piezoelectric element, and a diaphragm disposed between the pressure chamber and the piezoelectric element. The diaphragm has a crystal plane {110} of a single crystal silicon base. The piezoelectric element is disposed on the diaphragm so as to overlap an inner periphery of the pressure chamber in plan view, and has an inner edge on a center side of the pressure chamber with the inner periphery of the pressure chamber being sandwiched within the piezoelectric element in plan view. A shape of the inner edge of the piezoelectric element is such that in the smallest first rectangle, which includes the inner edge in plan view, the inner edge is on the inside of each of sides at a middle portion of each of the sides of the first rectangle. A shape of the inner periphery of the pressure chamber is such that in the smallest second rectangle, which includes the inner periphery in plan view, the inner periphery is on the inside of each of sides at a middle portion of each of the sides of the second rectangle. In a case where a direction of one side out of the first rectangle and the second rectangle lies along a crystal orientation <−110> in the crystal plane, a direction along a crystal orientation <−111> is in a range of ±25 degrees with respect to the crystal orientation <−111>. According to this configuration, in a case where the diaphragm is configured of the crystal plane {110} of the single crystal silicon base, the shape of the inner edge of the piezoelectric element and the shape of the inner periphery of the pressure chamber are shapes according to a Young's modulus of the crystal plane {110} of the diaphragm, which varies according to a crystal orientation. For this reason, a strain that occurs in the vibration region of the diaphragm, which overlaps the inner periphery of the pressure chamber in plan view, can be uniformized in the peripheral direction. Accordingly, since an excessive deflection of the diaphragm in an orientation in which a Young's modulus is low can be suppressed, the generation of a crack in the diaphragm or the piezoelectric element can be suppressed. On the other hand, since the diaphragm is likely to deflect in an orientation in which a Young's modulus is high, the inhibition of displacement of the entire diaphragm can be suppressed. Therefore, displacement efficiency can be improved while the generation of a crack is suppressed.

In the piezoelectric device, in a case where the direction of one side out of the first rectangle and the second rectangle lies along the crystal orientation <−110> in the crystal plane, a ratio of a short side to a long side of the first rectangle and the second rectangle may be lower than 1, and a ratio of the short side to the long side of the first rectangle and the second rectangle may approach 1 as an angle between the direction of one side out of the first rectangle and the second rectangle and the crystal orientation <−110> in the crystal plane becomes larger. According to this configuration, in a case where the diaphragm is configured of the crystal plane {110} of the single crystal silicon base, a certain degree of margin (for example, approximately ±35 degrees) can be ensured for a plane orientation offset angle of the single crystal silicon base. Also in this range, displacement efficiency can be improved while the generation of a crack in the diaphragm or the piezoelectric element is suppressed.

In the piezoelectric device, the shape of the inner edge of the piezoelectric element may be such that four corners of the inner edge are on the inside of four corners of the first rectangle, and the shape of the inner periphery of the pressure chamber may be such that four corners of the inner periphery are on the inside of four corners of the second rectangle. According to this configuration, the width of the piezoelectric element and the width of the pressure chamber can be made so as not to be excessively large in portions (four corners) corresponding to the orientation in which a Young's modulus is high. Accordingly, since an excessive deflection of the diaphragm can be suppressed in orientations of the four corners, the generation of a crack in the diaphragm or the piezoelectric element can be restricted.

In the piezoelectric device, each of the four corners of the piezoelectric element and the four corners of the pressure chamber may be curved. According to this configuration, a change in a strain in the vicinity of the orientations of the four corners of the piezoelectric element and the four corners of the pressure chamber can be eased.

In the piezoelectric device, the shape of the inner edge of the piezoelectric element and the shape of the inner periphery of the pressure chamber may be similar to each other in plan view. According to this configuration, a width from the inner periphery of the pressure chamber to the inner edge of the piezoelectric element, out of the widths of the piezoelectric element in the peripheral direction of the vibration region, can be made constant. Accordingly, since an even strain is likely to occur in the entire diaphragm, the displacement efficiency of the entire diaphragm can be improved.

According to still another aspect of the invention, there is provided a piezoelectric device including a pressure chamber, a piezoelectric element, and a diaphragm disposed between the pressure chamber and the piezoelectric element. The piezoelectric element is disposed on the diaphragm so as to overlap an inner periphery of the pressure chamber in plan view, and has an inner edge on a center side of the pressure chamber with the inner periphery of the pressure chamber being sandwiched within the piezoelectric element in plan view. The diaphragm has a crystal plane of an anisotropic single crystal silicon base of which a Young's modulus varies according to a direction in the crystal plane. A shape of the inner edge of the piezoelectric element is such that in the smallest first rectangle, which includes the inner edge in plan view, the inner edge is on the inside of each of sides at a middle portion of each of the sides of the first rectangle. A distance in a predetermined orientation is set as r1, a distance in any orientation is set as r, out of distances between a center of the pressure chamber and the inner edge of the piezoelectric element, a Young's modulus of the silicon base in the predetermined orientation is set as Y1, and a Young's modulus in any orientation is set as Y, the distance r has a relationship of $r=r1\times(Y/Y1)$. According to this configuration, the shape of the inner edge of the piezoelectric element and the shape of the inner periphery of the pressure chamber, which defines the vibration region of the diaphragm, can be made as shapes according to a Young's modulus of the diaphragm, which varies according to a crystal orientation. Accordingly, a strain of an inner peripheral portion of the piezoelectric element can be uniformized in any direction, which is the peripheral direction of the vibration region. Therefore, since an excessive deflection of the diaphragm in an orientation in which a Young's modulus is low can be suppressed, the generation of a crack in the diaphragm or the piezoelectric element can be suppressed. On the other hand, since the diaphragm is likely to deflect in an orientation in which a Young's modulus is high, the inhibition of displacement of the entire diaphragm can be suppressed. Therefore, displacement efficiency can be improved while the generation of a crack is suppressed.

According to still another aspect of the invention, there is provided a liquid discharging head including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging head including the piezoelectric device that can improve displacement efficiency while suppressing the generation of a crack can be provided.

According to still another aspect of the invention, there is provided a liquid discharging apparatus including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging apparatus including the piezoelectric device that can improve displacement efficiency while suppressing the generation of a crack can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
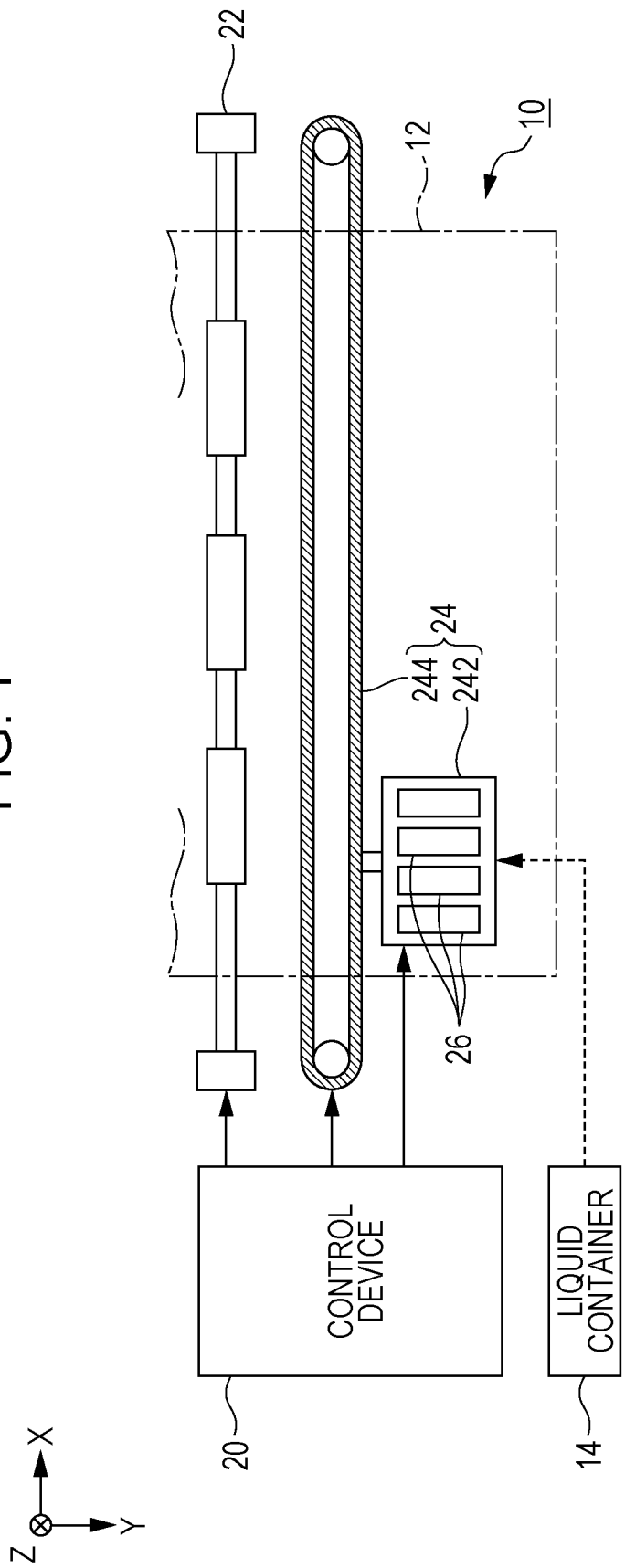
FIG. 1 is a view illustrating a configuration of a liquid discharging apparatus according to a first embodiment of the invention.

FIG. 1 is a view illustrating a configuration of a liquid discharging apparatus 10 according to a first embodiment of the invention. The liquid discharging apparatus 10 of the first embodiment is an ink jet printing apparatus that discharges an ink, which is an example of a liquid, onto a medium 12. Although the medium 12 is typical printing paper, any printing target such as a resin film and cloth can be used as the medium 12. As illustrated in FIG. 1, a liquid container 14 storing an ink is fixed to the liquid discharging apparatus 10. For example, a cartridge that is attachable/detachable to/from the liquid discharging apparatus 10, a bag-like ink pack formed of a flexible film, or an ink tank that can be refilled with an ink is used as the liquid container 14. A plurality of types of inks having different colors are stored in the liquid container 14.

As illustrated in FIG. 1, the liquid discharging apparatus 10 includes a control device 20, a transporting mechanism 22, a moving mechanism 24, and a plurality of liquid discharging heads 26. The control device 20 includes, for example, a processing circuit, such as a central processing unit (CPU) and a field programmable gate array (FPGA), and a memory circuit, such as a semiconductor memory, and comprehensively controls each element of the liquid discharging apparatus 10. The transporting mechanism 22 transports the medium 12 in a Y-direction under the control of the control device 20.

The moving mechanism 24 causes the plurality of liquid discharging heads 26 to reciprocate in an X-direction under the control of the control device 20. The X-direction is a direction intersecting (typically orthogonal to) the Y-direction in which the medium 12 is transported. The moving mechanism 24 includes a carriage 242 on which the plurality of liquid discharging heads 26 are mounted and an endless belt 244 to which the carriage 242 is fixed. It is also possible to mount the liquid container 14 on the carriage 242 with the liquid discharging heads 26.

Each of the plurality of liquid discharging heads 26 discharges an ink, which is supplied from the liquid container 14, onto the medium 12 from a plurality of nozzles (discharge holes) N under the control of the control device 20. A desired image is formed on an outer surface of the medium 12 by each of the liquid discharging heads 26 discharging an ink onto the medium 12 as the transportation of the medium 12 by the transporting mechanism 22 and the repeated reciprocation of the carriage 242 are performed at the same time. Hereinafter, a direction perpendicular to an XY-plane (for example, a plane parallel to the outer surface of the medium 12) will be referred to as a Z-direction. A direction (typical vertical direction), in which an ink is discharged by each of the liquid discharging heads 26, corresponds to the Z-direction.

Liquid Discharging Head

Figure 2:
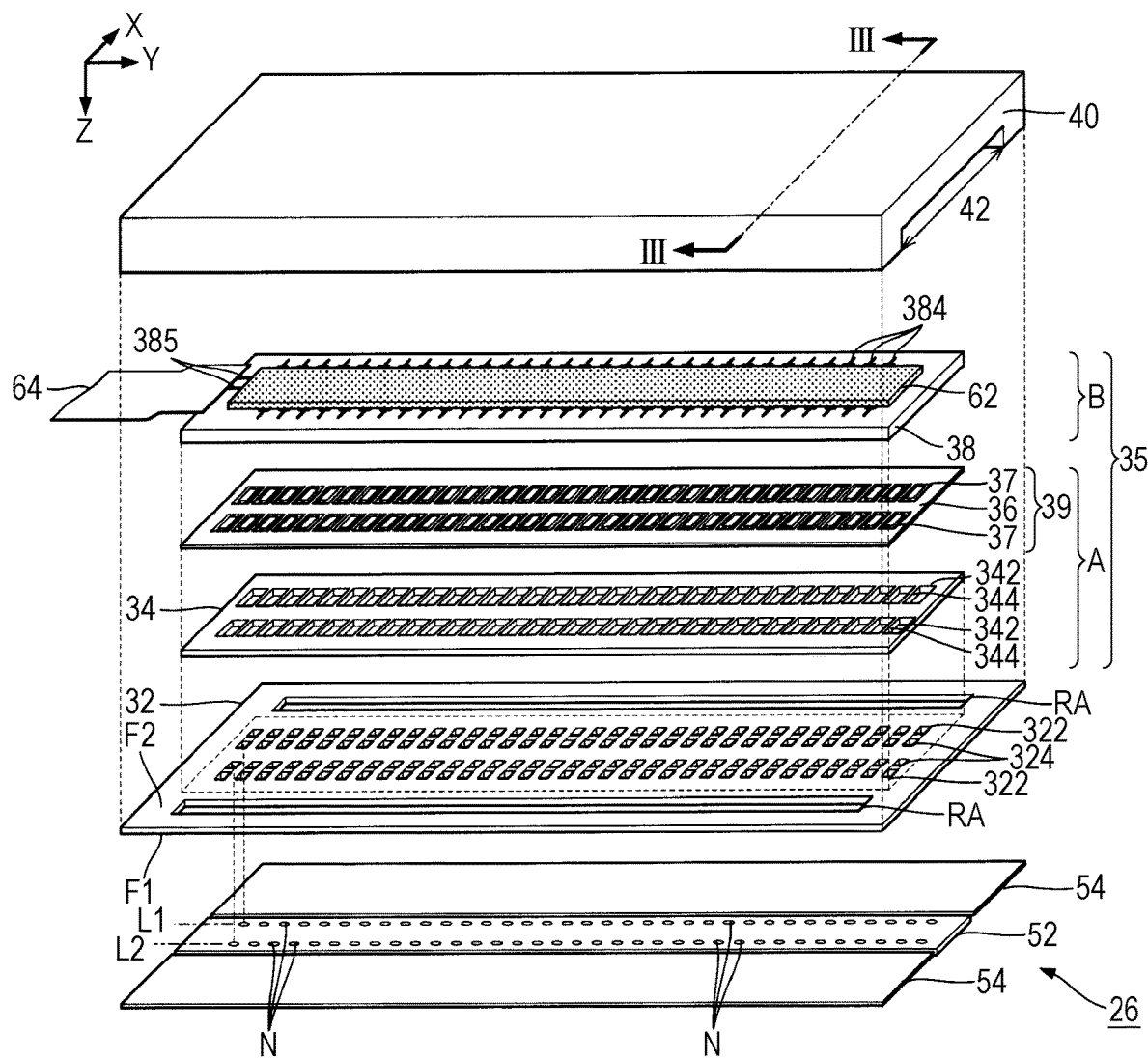
FIG. 2 is an exploded perspective view of a liquid discharging head.
Figure 3:
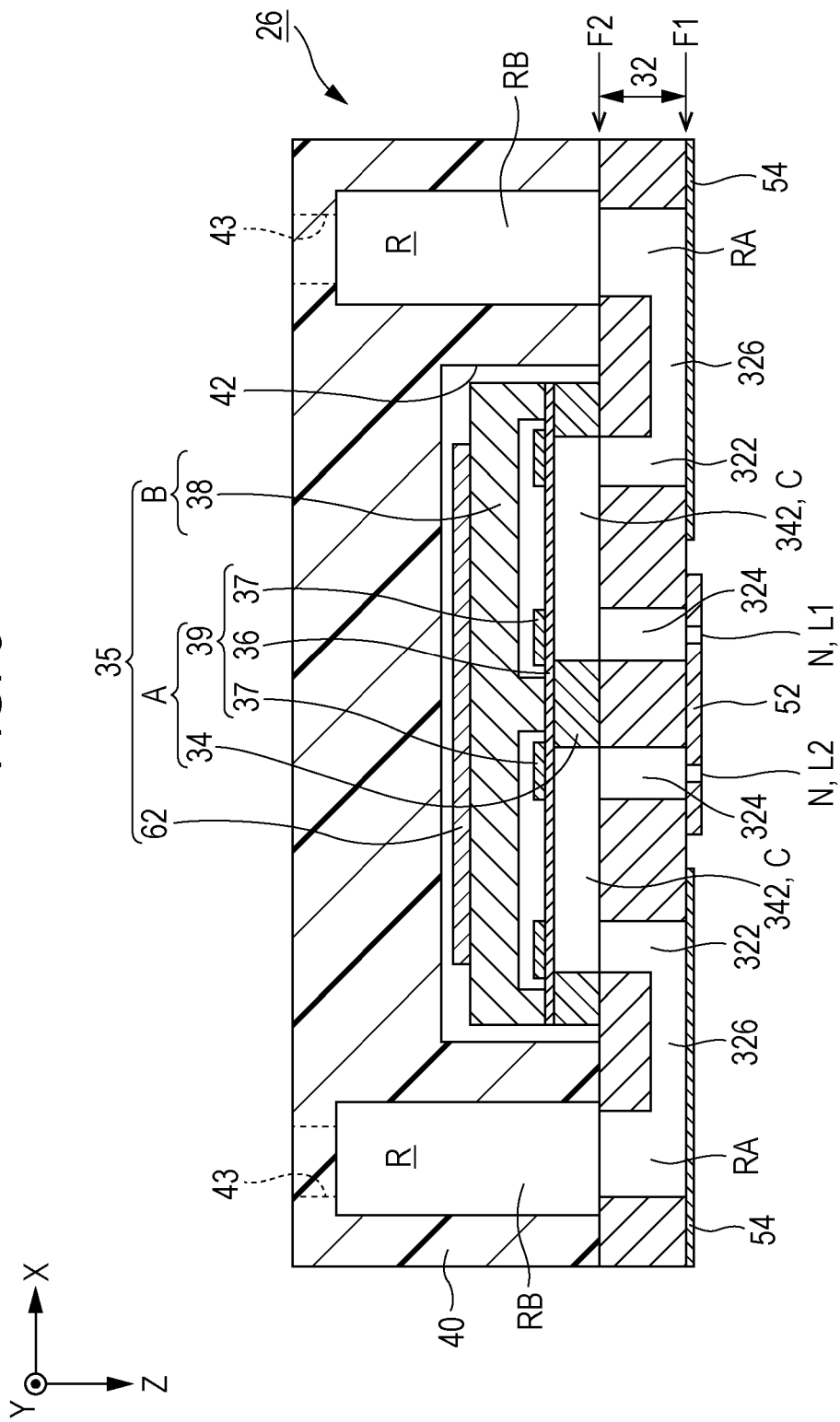
FIG. 3 is a sectional view of the liquid discharging head illustrated in FIG. 2 taken along line III-III.

FIG. 2 is an exploded perspective view of any one of the liquid discharging heads 26, and FIG. 3 is a sectional view taken along line III-III of FIG. 2. As illustrated in FIG. 2, the liquid discharging head 26 includes the plurality of nozzles N arranged in the Y-direction. The plurality of nozzles N of the first embodiment are classified into a first line L1 and a second line L2. Although it is also possible to make the positions of the nozzles N in the Y-direction different from each other between the first line L1 and the second line L2 (that is, zigzag disposition or staggered disposition), a configuration where the positions of the nozzles N in the Y-direction match the first line L1 and the second line L2 is given as an example in FIG. 3 for convenience. As illustrated in FIG. 2, the liquid discharging head 26 has a structure in which elements related to the plurality of nozzles N in the first line L1 and elements related to the plurality of nozzles N in the second line L2 are disposed so as to be substantially linearly symmetric to each other.

As illustrated in FIGS. 2 and 3, the liquid discharging head 26 includes a flow path substrate 32. The flow path substrate 32 is a plate-like member including an outer surface F1 and an outer surface F2. The outer surface F1 is an outer surface (outer surface on a medium 12 side) on a positive side of the Z-direction, and the outer surface F2 is an outer surface on a side (negative side of the Z-direction) opposite to the outer surface F1. A pressure generating unit 35 and a case member 40 are provided on the outer surface F2 of the flow path substrate 32, and a nozzle plate 52 and compliance substrates 54 are provided on the outer surface F1. Each element of the liquid discharging head 26 is a substantially plate-like member which is long in the Y-direction just as the flow path substrate 32. The elements are bonded to each other using, for example, an adhesive. It is also possible to perceive a direction, in which the flow path substrate 32 and a pressure chamber substrate 34 are stacked, as the Z-direction.

The pressure generating unit 35 is an element that causes a pressure change for discharging inks from the nozzles N. The pressure generating unit 35 of the embodiment is configured by a first substrate A including the pressure chamber substrate 34 and the piezoelectric device 39, a second substrate B including a wiring connection substrate (protection substrate) 38, and a drive IC 62 being bonded to each other. The piezoelectric device 39 is formed of pressure chambers C (to be described later) formed in the pressure chamber substrate 34, piezoelectric elements 37, and a diaphragm 36 disposed between the pressure chambers C and the piezoelectric elements 37, and is an element that causes a pressure change in the pressure chambers C by vibration. Details of the pressure generating unit 35 and the piezoelectric device 39 will be described later.

The nozzle plate 52 is a plate-like member in which the plurality of nozzles N are formed, and is provided on the outer surface F1 of the flow path substrate 32 using, for example, an adhesive. Each of the nozzles N is a through-hole through which an ink passes. The nozzle plate 52 of the first embodiment is manufactured by processing a single crystal silicon (Si) base (silicon substrate) using a semiconductor manufacturing technique. However, any known material or any known manufacturing method can be adopted in manufacturing the nozzle plate 52.

The flow path substrate 32 is a plate-like member for forming a flow path of an ink. As illustrated in FIGS. 2 and 3, a space RA, a plurality of supply flow paths 322, and a plurality of communication flow paths 324 are formed for each of the first line L1 and the second line L2 in the flow path substrate 32. The spaces RA are long openings which run in the Y-direction in plan view (that is, seen from the Z-direction), and the supply flow path 322 and the communication flow path 324 are through-holes formed for each of the nozzles N. The plurality of supply flow paths 322 are arranged in the Y-direction, and the plurality of communication flow paths 324 are also arranged in the Y-direction. As illustrated in FIG. 3, intermediate flow paths 326 which reach the plurality of supply flow paths 322 are formed in the outer surface F1 of the flow path substrate 32. Each of the intermediate flow paths 326 is a flow path connecting the space RA and the plurality of supply flow paths 322 together. The communication flow paths 324 communicate with the nozzles N.

The wiring connection substrate 38 of FIGS. 2 and 3 is a plate-like member for protecting the plurality of piezoelectric elements 37, and is provided on an outer surface (outer surface on a side opposite to the pressure chambers C) of the diaphragm 36. Although any material or any manufacturing method can be used for the wiring connection substrate 38, the wiring connection substrate 38 can be formed by processing a single crystal silicon (Si) base (silicon substrate) using a semiconductor manufacturing technique as in the case of the flow path substrate 32 and the pressure chamber substrate 34. As illustrated in FIGS. 2 and 3, the drive IC 62 is provided on an outer surface of the wiring connection substrate 38 (hereinafter, referred to as a "mount surface") on a side opposite to the outer surface (hereinafter, referred to as a "bonded surface") on a diaphragm 36 side. The drive IC 62 is a substantially rectangular IC chip on which a drive circuit that drives each of the piezoelectric elements 37 by generating and supplying a drive signal under the control of the control device 20 is mounted. On the mount surface of the wiring connection substrate 38, wiring 384 connected to an output terminal for a drive signal (drive voltage) of the drive IC 62 is formed for each of the piezoelectric elements 37. In addition, each of wiring pieces 385 connected to an output terminal for a base voltage (base voltage of a drive signal of each of the piezoelectric elements 37) of the drive IC 62 is consecutively formed on the mount surface of the wiring connection substrate 38 along the disposition of the piezoelectric elements 37 in the Y-direction.

The case member 40 illustrated in FIGS. 2 and 3 is a case for storing an ink to be supplied to the plurality of pressure chambers C (furthermore, the plurality of nozzles N). An outer surface of the case member 40 on the positive side of the Z-direction is fixed to the outer surface F2 of the flow path substrate 32 with, for example, an adhesive. As illustrated in FIGS. 2 and 3, a grooved recessed portion 42 extending in the Y-direction is formed in the outer surface of the case member 40 on the positive side of the Z-direction. The wiring connection substrate 38 and the drive IC 62 are accommodated inside the recessed portion 42. The case member 40 is formed of a material different from materials of the flow path substrate 32 and the pressure chamber substrate 34. It is possible to manufacture the case member 40 with, for example, a resin material by injection molding. However, any known material or any known manufacturing method can be adopted in manufacturing the case member 40. For example, a synthetic fiber or a resin material is suitable as a material of the case member 40.

As illustrated in FIG. 3, a space RB is formed for each of the first line L1 and the second line L2 in the case member 40. The spaces RB of the case member 40 and the spaces RA of the flow path substrate 32 communicate with each other. A space configured of the space RA and the space RB functions as a liquid storing chamber (reservoir) R storing an ink to be supplied to the plurality of pressure chambers C. The liquid storing chamber R is a common liquid chamber that reaches the plurality of nozzles N. An inlet 43 for causing an ink to be supplied from the liquid container 14 to flow into the liquid storing chamber R is formed for each of the first line L1 and the second line L2 in the outer surface of the case member 40 on a side opposite to the flow path substrate 32.

An ink supplied from the liquid container 14 to the inlet 43 is stored in the space RB and the space RA of the liquid storing chamber R. The ink stored in the liquid storing chamber R is divided into the plurality of supply flow paths 322 from the intermediate flow paths 326 so as to be supplied to and so as to fill each of the pressure chambers C in parallel.

As illustrated in FIG. 2, the compliance substrates 54 are provided on the outer surface F1. The compliance substrates 54 are flexible films that absorb a pressure change of an ink in the liquid storing chambers R. As illustrated in FIG. 3, the compliance substrates 54 are provided on the outer surface F1 of the flow path substrate 32 so as to close the spaces RA of the flow path substrate 32, the intermediate flow paths 326, and the plurality of supply flow paths 322, and configure wall surfaces (specifically, bottom surfaces) of the liquid storing chamber R.

The pressure generating unit 35 illustrated in FIG. 3 is configured by stacking the first substrate A, the second substrate B, and the drive IC 62. The first substrate A is a substrate that includes the pressure chamber substrate 34, the diaphragm 36, and the plurality of piezoelectric elements 37, and the second substrate B is a substrate that includes the wiring connection substrate 38.

The pressure chamber substrate 34 is a plate-like member, in which a plurality of openings 342 configuring the pressure chambers C are formed for each of the first line L1 and the second line L2, and is provided on the outer surface F2 of the flow path substrate 32 using, for example, an adhesive. The plurality of openings 342 are arranged in the Y-direction. Each of the openings 342 is a through-hole, which is formed for each of the nozzles N and runs in the X-direction in plan view. The flow path substrate 32 and the pressure chamber substrate 34 are manufactured by processing single crystal silicon (Si) substrates (silicon substrates) using a semiconductor manufacturing technique as in the case of the nozzle plate 52 described above. However, any known material and any known method can be adopted in manufacturing the flow path substrate 32 and the pressure chamber substrate 34. The piezoelectric device 39 is provided on an outer surface of the pressure chamber substrate 34 on a side opposite to the flow path substrate 32.

Piezoelectric Device

Figure 4:
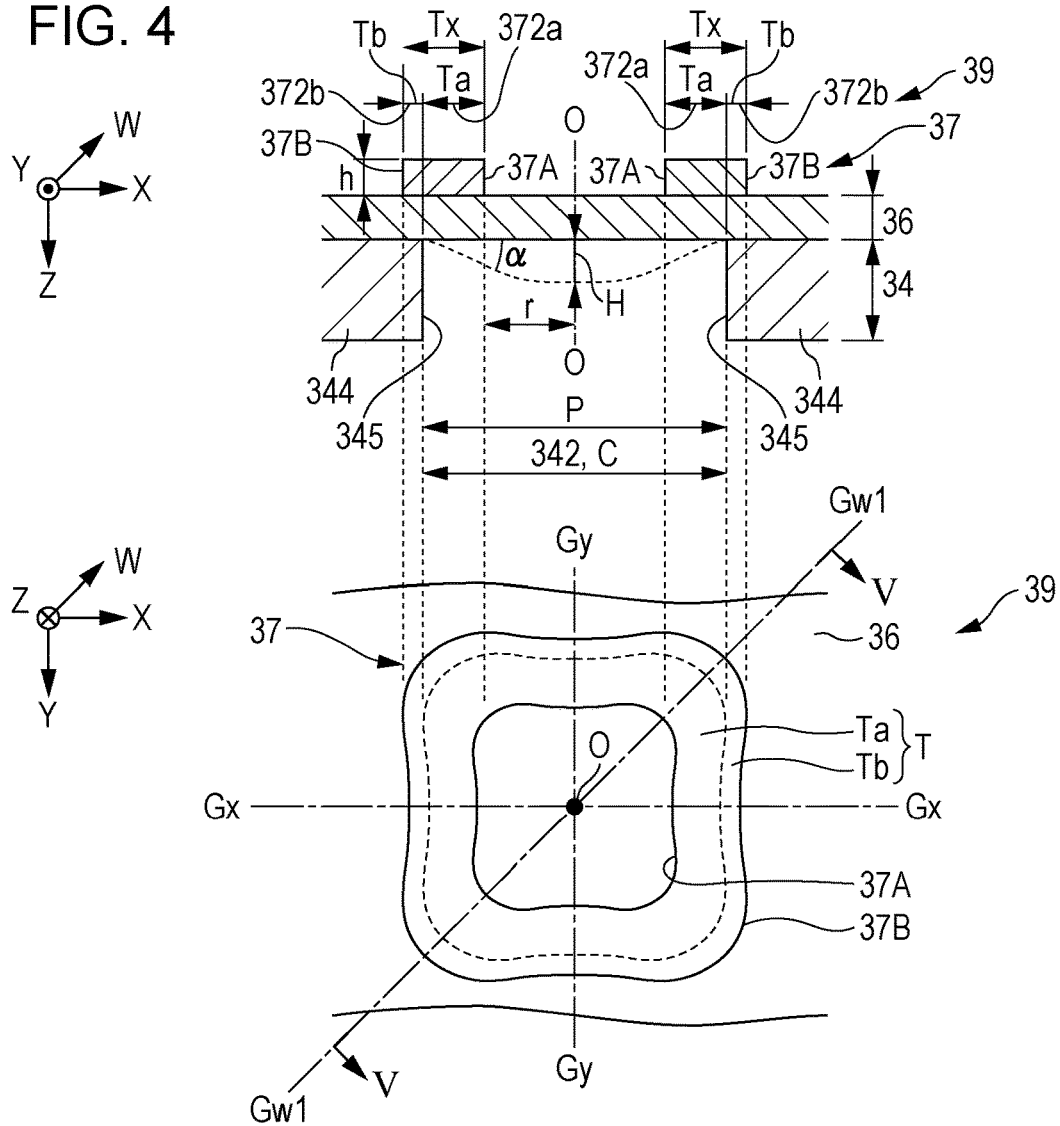
FIG. 4 is a sectional view and a plan view of a piezoelectric device.
Figure 5:
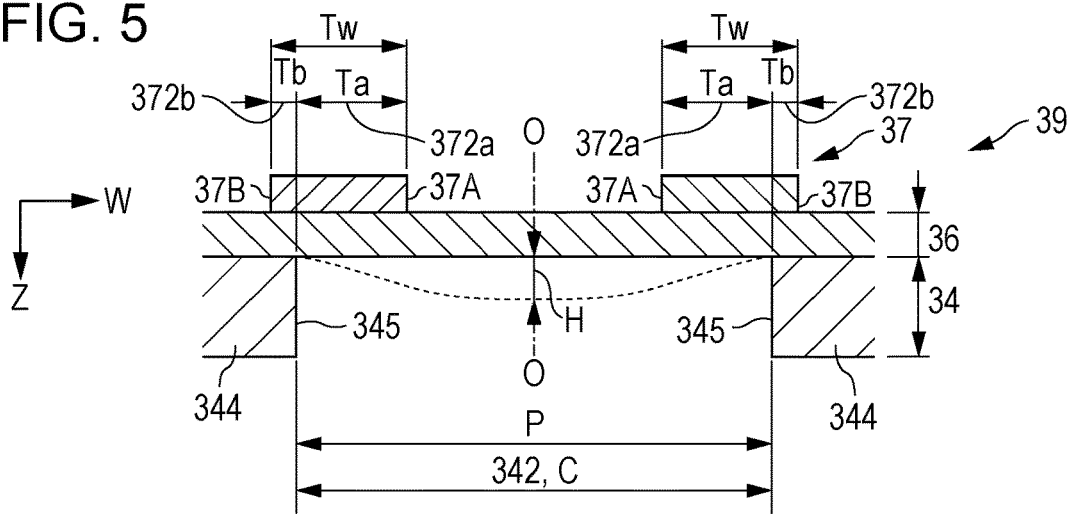
FIG. 5 is a sectional view of the piezoelectric device illustrated in FIG. 4 taken along line V-V.

FIG. 4 is a sectional view and a plan view of the enlarged piezoelectric device 39. The sectional view (view on the upper side of FIG. 4) of FIG. 4 is a view obtained by cutting the piezoelectric device 39 with an XZ-plane, and the plan view (view on the lower side of FIG. 4) of FIG. 4 is a view in which the piezoelectric device 39 is seen from the Z-direction. FIG. 5 is a sectional view of the piezoelectric device 39 illustrated in FIG. 4 taken along line V-V. A W direction of FIGS. 4 and 5 is a direction where an angle of 45 degrees is formed counterclockwise from the X-direction, and is a direction along an axis Gw1. FIG. 5 is a sectional view of the piezoelectric device 39 cut in the direction along the axis Gw1.

As illustrated in FIGS. 4 and 5, the piezoelectric device 39 is formed of the pressure chambers C, the piezoelectric elements 37, and the diaphragm 36, and causes a pressure change in each of the pressure chambers C by the piezoelectric elements 37 vibrating the diaphragm 36. The shape of the inner periphery 345 of the pressure chamber C of FIG. 4 is a substantially rectangle in plan view. The shape of the inner periphery 345 of the pressure chamber C is the shape of the inner periphery 345 of a side wall 344 of the pressure chamber C in plan view seen from the Z-direction, and defines a vibration region P of the diaphragm 36. The vibration region P of the diaphragm 36 is a region of the diaphragm 36, which overlaps the pressure chamber C in plan view, and is a region that configures a wall surface (top surface) of the pressure chamber C.

By the piezoelectric element 37 of FIG. 4 being disposed on the peripheral portion of the pressure chamber C and deflecting the periphery of the vibration region P of the diaphragm 36, the diaphragm 36 is displaced in the Z-direction. Specifically, the piezoelectric element 37 is disposed on the diaphragm 36 so as to overlap the inner periphery 345 of the pressure chamber C in plan view. The piezoelectric element has the inner edge 37A on a center O side of the pressure chamber C and has the outer edge 37B on a side wall 344 side of the pressure chamber C with the inner periphery 345 of the pressure chamber C being sandwiched between the outer edge and the inner edge. A case where the entire perimeter of the piezoelectric element 37 is annularly formed so as to overlap the entire perimeter of the inner periphery 345 of the pressure chamber C in plan view is given as an example in FIG. 4. However, the piezoelectric elements 37 may have a configuration of overlapping some parts of the inner peripheries 345 instead of the entire perimeters of the inner peripheries 345 of the pressure chambers C.

The shapes of the inner edge 37A and the outer edge 37B of the piezoelectric element 37 of FIG. 4 are substantially rectangles in plan view (seen from the Z-direction). The shapes of the inner edge 37A and the outer edge 37B of the piezoelectric element 37 are similar to the shape of the inner periphery 345 of the pressure chamber C (the shape of the vibration region P). In FIG. 4, a case where the shape of the inner edge 37A and the shape of the outer edge 37B of the piezoelectric element 37 are also similar to each other is given as an example.

As illustrated in FIGS. 2 and 3, the outer surface F2 of the flow path substrate 32 and the diaphragm 36 face each other at an interval inside each of the openings 342. A space positioned inside each of the openings 342 between the outer surface F2 of the flow path substrate 32 and the diaphragm 36 functions as each of the pressure chambers C for applying a pressure to an ink which has filled the space. The pressure chamber C is separately formed for each of the nozzles N. As illustrated in FIG. 2, the plurality of pressure chambers C (openings 342) are arranged in the Y-direction for each of the first line L1 and the second line L2. Any one of the pressure chambers C communicates with the space RA via the supply flow path 322 and the intermediate flow path 326, and communicates with the nozzle N via the communication flow path 324.

As illustrated in FIGS. 2 and 3, the plurality of piezoelectric elements 37 corresponding to different nozzles N are provided for each of the first line L1 and the second line L2 on an outer surface of the diaphragm 36 on a side opposite to the pressure chambers C. The piezoelectric elements 37 are pressure generating elements that deform due to supply of a drive signal and generate pressures in the pressure chambers C. Each of the plurality of piezoelectric elements 37 is arranged in the Y-direction so as to correspond to each of the pressure chambers C.

Each of the piezoelectric elements 37 is a stacked body of which a piezoelectric layer is sandwiched between a first electrode and a second electrode, which face each other. By applying a voltage to an area between the first electrode and the second electrode, a piezoelectric strain occurs in the piezoelectric layer sandwiched between the first electrode and the second electrode and thus the piezoelectric layer is displaced. Therefore, each of the piezoelectric elements 37 is a portion in which the first electrode, the second electrode, and the piezoelectric layer overlap each other. A pressure in each of the pressure chambers C changes by the diaphragm 36 vibrating in tandem with a piezoelectric strain of the piezoelectric layer 373. An adhesive layer for ensuring adhesion may be provided between the piezoelectric elements 37 and the diaphragm 36. That is, it is not necessary for the piezoelectric elements 37 to be directly provided on the outer surface of the diaphragm 36, and the piezoelectric elements may be provided on the outer surface of the diaphragm 36 via the adhesive layer. Zirconium, a zirconium oxide, titanium, a titanium oxide, and a silicon oxide can be used for the adhesive layer.

As illustrated in FIGS. 4 and 5, the diaphragm 36 is a plate-like member that can elastically vibrate. The diaphragm 36 of the embodiment is configured of an anisotropic single crystal silicon base of which a Young's modulus varies according to a direction in a crystal plane, and the outer surface of the diaphragm 36 is configured of a crystal plane of the single crystal silicon base. However, a crystal of the single crystal silicon base is not limited to being as the outer surface of the diaphragm 36, and may be included at least in the diaphragm 36. For example, in a case where the diaphragm 36 is formed by stacking a plurality of materials, the crystal of the single crystal silicon base may be included in the stacked materials. The diaphragm 36 is stacked and bonded to the side walls 344 (pressure chamber substrate 34) of the pressure chambers C and configures a wall surface (specifically, a top surface) intersecting the side walls 344 of the pressure chambers C. As described above, the vibration regions P of the diaphragm 36 are regions (regions configuring the top surfaces of the pressure chambers C) of the diaphragm 36, which overlap the pressure chambers C in plan view, and are deflected by the piezoelectric elements 37 so as to be displaced in the Z-direction.

Each of the piezoelectric elements 37 of the embodiment includes an inner peripheral portion 372a that overlaps the pressure chamber C in plan view (seen from the Z-direction) and an outer peripheral portion 372b that overlaps the side wall 344 of the pressure chamber C in plan view. The inner peripheral portions 372a are portions that are displaced in the Z-direction with the diaphragm 36 in tandem with piezoelectric strains of piezoelectric layers 373. The outer peripheral portions 372b are portions (portions that are not displaced in the Z-direction) of which displacement in the Z-direction is restrained by the side walls 344 of the pressure chambers C. When a longitudinal strain occurs in the piezoelectric elements 37 in the Z-direction, a lateral strain occurs in a direction (direction in the XY-plane) orthogonal to the Z-direction. That is, when an extension strain occurs in the Z-direction, a contraction strain occurs in the direction in the XY-plane, and when a contraction strain occurs in the Z-direction, an extension strain occurs in the direction in the XY-plane. Therefore, when a piezoelectric strain occurs in the piezoelectric elements 37 in the Z-direction, the outer peripheral portions 372b are not displaced by the displacement in the Z-direction but a strain occurs in the direction in the XY-plane. For this reason, as will be described later, displacement H of the vibration regions P can be improved not only by changing the widths of the inner peripheral portions 372a but also the widths of the outer peripheral portions 372b.

Each of the vibration regions P of the embodiment is a substantially rectangle which is the same as the pressure chamber C in plan view, and has an axis Gx that passes through a center O in the X-direction and an axis Gy that passes through the center O in the Y-direction. In a case where each of the vibration regions P has a shape of which the length in a direction of the axis Gy and the length in a direction of the axis Gx are different from each other, a short axis of the smallest rectangle, which includes one of the vibration regions P, will be set as the axis Gy of the vibration region P and a long axis of the smallest rectangle, which includes the vibration region P, will be set as the axis Gx of the vibration region P. The axis Gw illustrated in FIG. 4 is an axis along a direction of 45 degrees counterclockwise from the axis Gx.

In the piezoelectric device 39 having such a configuration, the displacement H in the Z-direction occurs in the vibration regions P of the diaphragm 36 due to piezoelectric strains of the piezoelectric elements 37 as illustrated with dotted lines of FIGS. 4 and 5. In this case, for example, a Young's modulus of a crystal plane of a silicon base changes according to a direction in the crystal plane.

Figure 6:
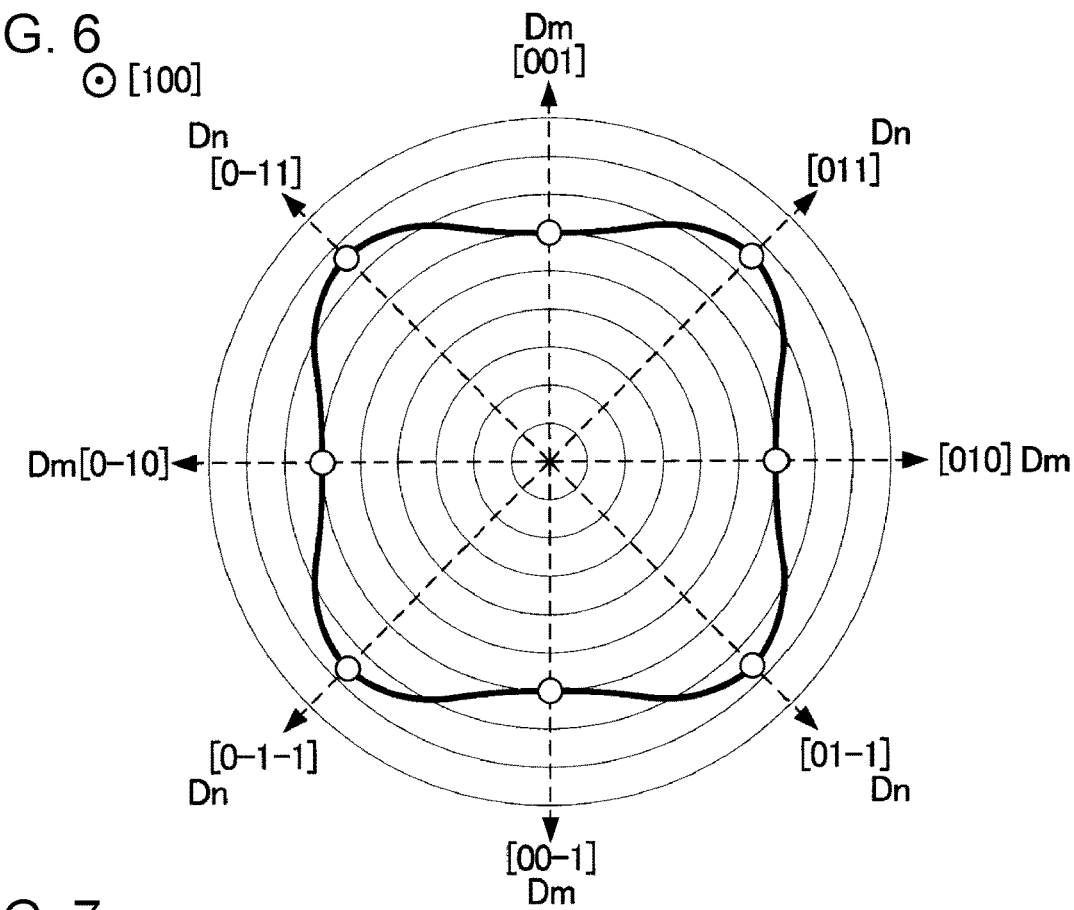
FIG. 6 is a graph showing an example of anisotropy of a Young's modulus of a single crystal silicon base in a (100) plane.

FIG. 6 is a graph showing an example of anisotropy of a Young's modulus in a (100) plane of a single crystal silicon base of which the crystal plane is the (100) plane (crystal plane orientation perpendicular to the crystal plane is [100]). FIG. 6 is expressed in polar coordinates, and the Young's modulus becomes higher as a distance from the center becomes longer. The Young's modulus in the (100) plane of the single crystal silicon base of which the crystal plane is the (100) plane has substantially square anisotropy. In FIG. 6, a Young's modulus is a minimum value in four crystal orientations [010], [001], [0-10], and [00-1]. When the orientations are set as Dm, a Young's modulus is a maximum value at orientations Dn of, for example, 45 degrees counterclockwise from the orientations Dm.

Since the diaphragm 36 is more unlikely to deflect in the orientations Dn in which a Young's modulus is high than in the orientations Dm in which a Young's modulus is low in a case where the diaphragm 36 is configured of such a silicon base, there is a possibility that the displacement of the diaphragm 36 is inhibited as a whole. On the other hand, since the diaphragm 36 is likely to deflect in the orientation Dm in which a Young's modulus is low, a crack is likely to be generated in the diaphragm 36 when the diaphragm deflects excessively. When a crack is generated, the piezoelectric elements 37 or the pressure chambers C are destroyed in some cases. As described above, in a case where the diaphragm 36 is manufactured of the single crystal silicon base of which the crystal plane is the (100) plane, there are orientations in which a Young's modulus varies on the periphery of the diaphragm 36 according to a direction. Thus, there is a possibility that the displacement of the diaphragm 36 is inhibited as a whole, or a crack is likely to be generated when the pressure chambers C and the piezoelectric elements 37 are configured in shapes without considering a crystal orientation.

In the first embodiment, the shape of the inner edge 37A of the piezoelectric element 37 and the shape of the inner periphery 345 of the pressure chamber C are made as shapes according to a Young's modulus of the diaphragm 36, which varies according to a crystal orientation. For example, in FIG. 4, when the direction of the axis Gx is made so as to lie in the orientation Dm of FIG. 6, in which a Young's modulus is low, the direction of the axis Gw1 becomes a direction along the orientation Dn in which a Young's modulus is high. Thus, a shape according to such a change of the Young's modulus in a peripheral direction is given as an example. According to such a shape, a strain that occurs in the vibration region P of the diaphragm 36, which overlaps the inner periphery 345 of the pressure chamber C in plan view, can be uniformized in the peripheral direction. Therefore, the entire diaphragm 36 is likely to be displaced, and thus the displacement efficiency of the diaphragm 36 can be improved.

Hereinafter, a relationship among the shape of the inner edge 37A of the piezoelectric element 37, the shape of the inner periphery 345 of the pressure chamber C, an orientation of a Young's modulus, and the displacement of the vibration region P of the diaphragm 36 will be described. As illustrated in the sectional view of FIG. 4, a distance between the center (center of the vibration region P of the diaphragm 36) O of the pressure chamber C and the inner edge 37A of the piezoelectric element 37 will be set as r, the thickness of the piezoelectric element 37 will be set as h, the width of the inner peripheral portion 372a will be set as Ta, and a deflection angle (deflection angle of the peripheral portion of the vibration region P) of a minute region δb of the peripheral portion of the piezoelectric element 37 when deflection moment M has occurred in the piezoelectric element 37 will be set as α. In addition, the displacement of the center O will be set as H, and a Young's modulus of the diaphragm 36 in a diameter direction will be set as Y. Then, α, which is the deflection angle of the vibration region P, can be expressed as the following Equation (1), and the displacement H of the vibration region P can be expressed as the following Equation (2).

$$\alpha = \{6W/(\delta b \times Ta^2)\} \times M \times (1/Y) \quad (1)$$

$$H = r \cos \alpha \quad (2)$$

Herein, a distance between the inner edge 37A of the piezoelectric element 37 and the center O in a predetermined orientation will be set as r1 and a distance in any orientation will be set as r. A Young's modulus of the silicon base in a predetermined orientation will be set as Y1 and a Young's modulus in any orientation will be set as Y. Displacement occurred when the deflection angle of the vibration region P is α1 will be set as H1 and displacement occurred when a deflection angle is α will be set as H. When a relationship of the following Equation (3) is satisfied, a strain is uniformized in the peripheral direction of the vibration region P.

$$H = r \cos \alpha = r1 \cos \alpha1 = H1 \quad (3)$$

$$r = r1 \times (\tan \alpha1/\tan \alpha) \quad (4)$$

Since r can be expressed as Equation (4) from Equation (3) and α and α1 are minute, tan α1 can be regarded as α1 and tan α can be regarded as α. Thus, the following Equation (5) can be derived from Equation (1) and Equation (4). For example, a crystal orientation of [−111] can be selected as the predetermined orientation. Without being limited thereto, however, other crystal orientations may be selected.

$$r = r1 \times (\alpha1/\alpha) = r1 \times (Y/Y1) \quad (5)$$

Therefore, by the inner edge 37A of the piezoelectric element 37 having a shape that satisfies a relationship of Equation (5), the shape of the inner edge 37A of the piezoelectric element 37 and the shape of the inner periphery 345 of the pressure chamber C can have shapes according to a Young's modulus of the diaphragm 36, which varies according to a crystal orientation. Accordingly, strains of the inner peripheral portions 372a of the piezoelectric elements 37 can be uniformized in the peripheral direction of the vibration region P. By making the shape of the inner periphery 345 of the pressure chamber C (the shape of the vibration region P) similar to the shape of the inner edge 37A of the piezoelectric element 37 as illustrated in the plan view of FIG. 4, a strain of the diaphragm 36 can also be uniformized in the peripheral direction of the vibration region P.

According to the configuration, since an excessive deflection of the diaphragm 36 in an orientation in which a Young's modulus is low can be suppressed, the generation of a crack in the diaphragm 36 or the piezoelectric elements 37 can be suppressed. On the other hand, since the diaphragm is likely to deflect in an orientation in which a Young's modulus is high, the inhibition of displacement of the entire diaphragm 36 can be suppressed. Therefore, displacement efficiency can be improved while the generation of a crack in the diaphragm 36 or the piezoelectric elements 37 is suppressed.

Figure 7:
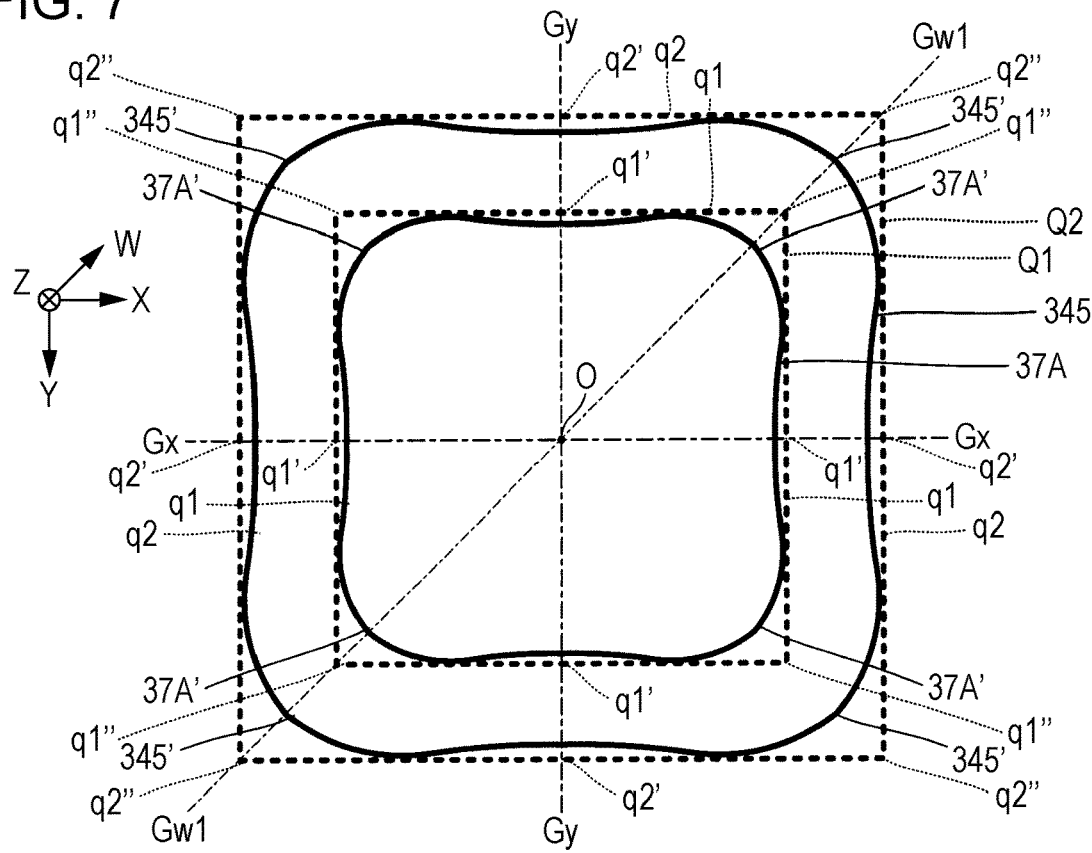
FIG. 7 is a view of an enlarged shape of an inner edge of the piezoelectric element of FIG. 4.

FIG. 7 is a view of the enlarged shape of the inner edge 37A of the piezoelectric element 37 of FIG. 4. FIG. 7 is a view in which the shape of the inner edge 37A of the piezoelectric element 37 is a shape that satisfies the relationship of Equation (5) in a case where the outer surface of the diaphragm 36 is configured of the crystal plane (100) of the single crystal silicon base. The shape of the inner edge 37A of the piezoelectric element 37 of FIG. 7 almost matches the anisotropy of the Young's modulus of FIG. 6.

For example, the shape of the inner edge 37A of the piezoelectric element 37 of FIG. 7 is such that in the smallest first rectangle Q1 (herein, a square), which includes the inner edge 37A of the piezoelectric element 37 in plan view, the inner edge 37A is on the inside of a middle portion q1' of each side q1 out of the four sides q1 of the first rectangle Q1. In addition, the shape of the inner periphery 345 of the pressure chamber C is such that in the smallest second rectangle Q2 (herein, a square), which includes the inner periphery 345 of the pressure chamber C in plan view, the inner periphery 345 is on the inside of a middle portion q2' of each side q2 out of the four sides q2 of the second rectangle Q2. The middle portions q1' and q2' are portions of the sides q1 and q2, which overlap the axis Gx in the direction along the axis Gx, and are portions of the sides q1 and q2, which overlap the axis Gy in the direction along the axis Gy. Orientations of the middle portions q1' and q2' (the direction of the axis Gx and the direction of the axis Gy) match the crystal Orientations Dm in which a Young's modulus is a minimum value. The direction of one side out of the first rectangle Q1 and the second rectangle Q2 (direction of the axis Gx) lies along the crystal orientation [010] in the crystal plane. However, since the first rectangle Q1 and the second rectangle Q2 are squares in the first embodiment, the direction of the axis Gy may lie along the crystal orientation [010] in the crystal plane.

According to such a shape, since the widths of the pressure chambers C (the widths of the vibration regions P) and the widths of the piezoelectric elements 37 can be made smaller in the crystal orientations Dm in which a Young's modulus is a minimum value, a crack in the diaphragm 36 is unlikely to be generated. On the other hand, since the widths of the pressure chambers C (the widths of the vibration regions P) and the widths of the piezoelectric elements 37 can be made larger in the crystal orientations Dn in which a Young's modulus is a maximum value than in the crystal orientations Dm in which a Young's modulus is a minimum value, the vibration regions P are likely to deflect and thus the displacement efficiency of the entire diaphragm 36 can be improved.

Since the shape of the inner edge 37A of the piezoelectric element 37 and the shape of the inner periphery 345 of the pressure chamber C are similar to each other in plan view, the width (width that overlaps the pressure chamber C in plan view) Ta from the inner periphery 345 of the pressure chamber C to the inner edge 37A of the piezoelectric element 37, which is included in the width T of the piezoelectric element 37 in the peripheral direction of the vibration region P, can be made constant. Accordingly, since an even strain is likely to occur in the entire diaphragm 36, the displacement efficiency of the entire diaphragm 36 can be improved.

In addition, the shape of the inner edge 37A of the piezoelectric element 37 is such that four corners 37A' of the inner edge 37A are on the inside of four corners q1" of the first rectangle Q1, and the shape of the inner periphery 345 of the pressure chamber C is such that four corners 345' of the inner periphery 345 are on the inside of four corners q2" of the second rectangle Q2. According to this, the widths of the piezoelectric elements 37 and the widths of the pressure chambers C can be made so as not to be excessively large in portions (four corners of the graph of the Young's modulus in FIG. 6) corresponding to the orientations Dn in which a Young's modulus is high. Accordingly, since an excessive deflection of the diaphragm 36 can be suppressed in the orientations Dn of the four corners, the generation of a crack in the diaphragm 36 or the piezoelectric elements 37 can be restricted. Each of the four corners 37A' of the piezoelectric element 37 and the four corners 345' of the pressure chamber C is curved. According to this configuration, a change in a strain in the vicinity of the orientations of the four corners 37A' of the piezoelectric element 37 and the four corners 345' of the pressure chamber C can be eased.

However, the shapes of the pressure chambers C and the piezoelectric elements 37 may be shapes close to the shape that satisfies Equation (5) without being limited to the shape (optimal shape) that satisfies Equation (5). In a case where the diaphragm 36 of the embodiment is manufactured, the diaphragm is manufactured by aligning a direction of the diaphragm 36 with a crystal orientation of a silicon base (silicon wafer) and cutting the diaphragm 36 out. In the embodiment, a silicon wafer formed of a single crystal silicon base of which the crystal plane is the (100) plane is used to form the diaphragm 36, for example, such that the direction of the axis Gx of the vibration region P is aligned with the crystal orientation [010] in the crystal plane. The diaphragm is cut out from the silicon wafer. At this time, a certain degree of margin (for example, approximately ±35 degrees) can be ensured for a plane orientation offset angle of a silicon wafer to be used by ensuring a certain degree of margin also in the shapes of the pressure chambers C and the piezoelectric elements 37. Herein, an angle (clockwise angle) from the crystal orientation [010] toward a crystal orientation [01-1] in FIG. 6 will be set as negative (−) and an angle (counterclockwise angle) from the crystal orientation [010] toward the crystal orientation [011] will be set as positive (+).

Specifically, a distance between the inner edge 37A of the piezoelectric element 37 and the side q1 of the first rectangle Q1 in the first direction is 0.79 times or more to 1 time or less with respect to a distance between the inner edge 37A of the piezoelectric element 37 and a side of the first rectangle Q1 in the second direction orthogonal to the first direction, in the middle portion q1' of each side q1 of the first rectangle Q1 illustrated in FIG. 7. In addition, a distance between the inner periphery 345 of the pressure chamber C and the side q2 of the second rectangle Q2 in the first direction is 0.79 times or more to 1 time or less with respect to a distance between the inner periphery 345 of the pressure chamber C and the side q2 of the second rectangle Q2 in the second direction orthogonal to the first direction, in the middle portion q2' of each side q2 of the second rectangle Q2. It is preferable that a ratio (aspect ratio) of a length in the second direction to a length in the first direction be 0.8 or more and 1 or less.

Figure 8:
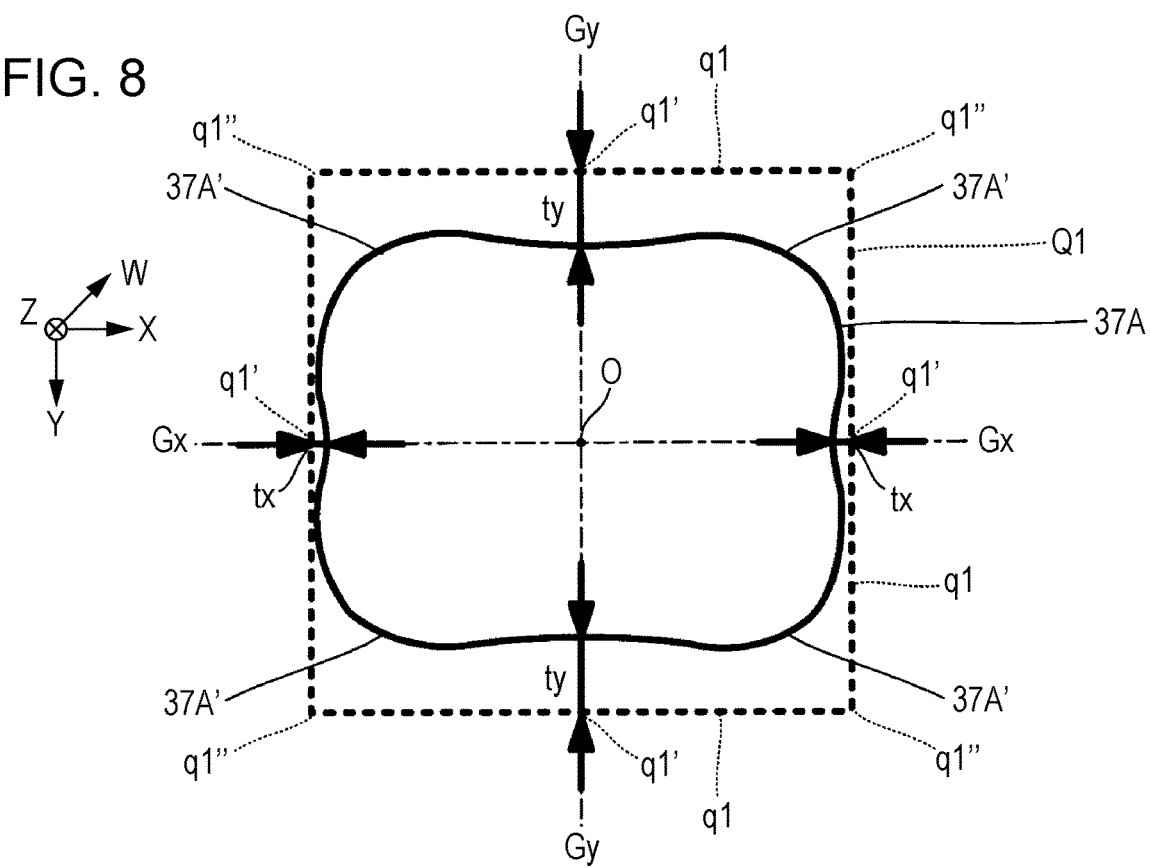
FIG. 8 is a plan view illustrating a shape of an inner edge of a piezoelectric element according to a first modification example of the first embodiment.
Figure 9:
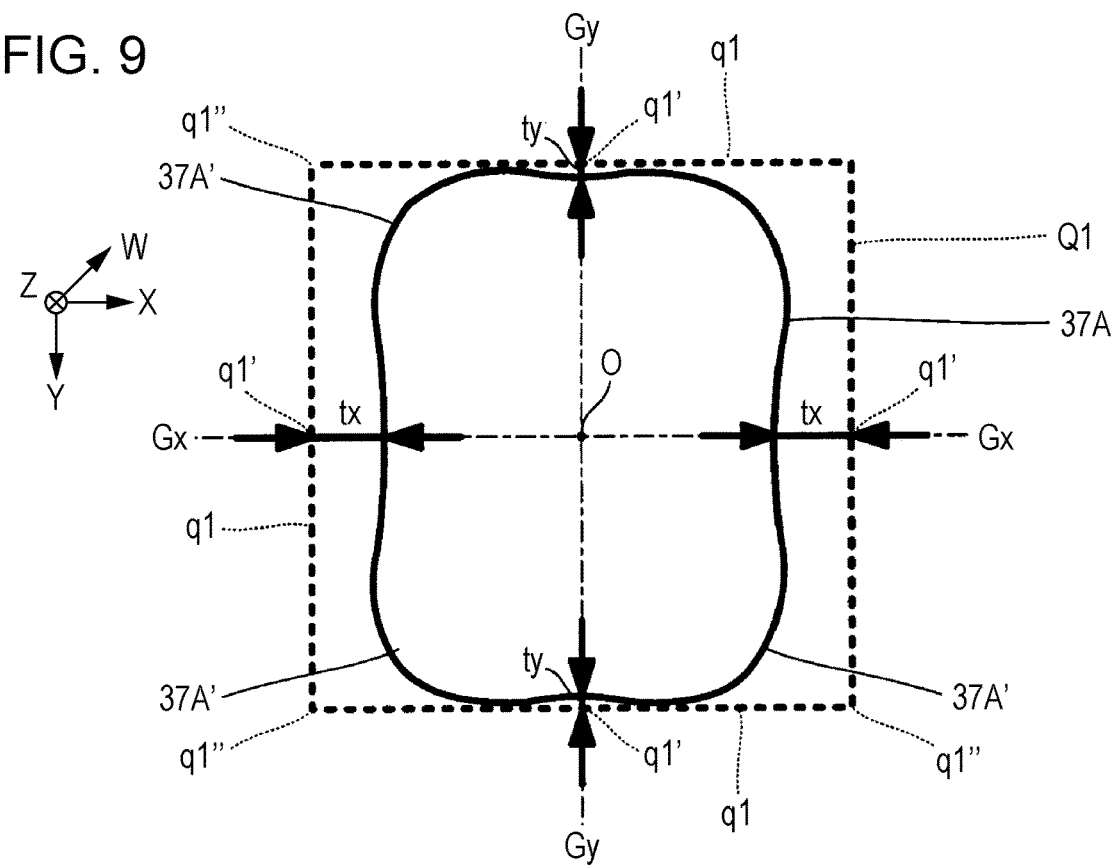
FIG. 9 is a plan view illustrating a shape of an inner edge of a piezoelectric element according to a second modification example of the first embodiment.

The shape of the inner edge 37A of the piezoelectric element 37, for example, in a case where the axis Gx is set as the first direction and the axis Gy is set as the second direction is described in a first modification example of the first embodiment illustrated in FIG. 8. As for the shape of FIG. 8, a distance tx in the direction along the axis Gx is a length which is 0.798 times with respect to a distance ty in the direction along the axis Gy. As for the entire shape, a ratio (aspect ratio) of a length in the direction of the axis Gx to a length in the direction of the axis Gy is approximately 0.8, as illustrated in FIG. 8. In addition, the shape of the inner edge 37A of the piezoelectric element 37, for example, in a case where the axis Gx is set as the second direction and the axis Gy is set as the first direction is described in a second modification example of the first embodiment illustrated in FIG. 9. As for the shape in FIG. 9, the distance ty in the direction along the axis Gy is a length 0.798 times with respect to the distance tx in the direction along the axis Gx. As for the entire shape, a ratio (aspect ratio) of a length in the direction of the axis Gy to a length in the direction of the axis Gx is approximately 0.8 in FIG. 9. FIGS. 8 and 9 illustrate permissible ranges of the shapes of the inner edges 37A.

According to such a configuration, a margin of approximately ±35 degrees (for example, a range where the (100) substrate is not referred to as the (112) substrate) can be ensured for a plane orientation offset angle of a silicon base to be used. Even in this range, displacement efficiency can be improved while the generation of a crack in the diaphragm 36 or the piezoelectric elements 37 is suppressed. Although the shape of the inner edge 37A of the piezoelectric element 37 is given as an example in FIGS. 8 and 9, the same applies to the shape of the inner periphery 345 of the pressure chamber C.

Although a case where the crystal plane (100) of the single crystal silicon base is the outer surface (top surface) of the diaphragm 36 has been described in the embodiment, the configuration of the embodiment is applicable also to a case where a (010) plane or a (001) plane, which is a crystal plane equivalent to the crystal plane (100), is the outer surface (top surface) of the diaphragm 36 since single crystal silicon has a cubic crystal system. Even when the crystal plane is the (010) plane or the (001) plane, the Young's modulus is in a shape shown in FIG. 6. However, in a case where the crystal plane is the (010) plane, crystal orientations [−100], [−101], and [001] are applied by replacing the three reference crystal orientations [010], [011], and [001] in FIG. 6, respectively. In a case where the crystal plane is the (001) plane, crystal orientations [010], [−110], and [−100] are applied by replacing the crystal orientations [010], [011], and [001] in FIG. 6, respectively. As described above, all of the crystal planes (100), (010), and (001) are equivalent to each other, and a plane group of the crystal planes can be altogether referred to as a crystal plane {100}. In addition, since the crystal orientation [010] in the (100) plane, the crystal orientation [−100] in the (010) plane, and the crystal orientation [010] in the (001) plane are equal to each other, a direction group of the crystal orientation [010] and equivalents thereof can be altogether referred to as a crystal orientation <010>.

Second Embodiment

A second embodiment of the invention will be described. In each form to be given as an example below, elements, of which operation and functions are the same as in the first embodiment, will be assigned with the same reference signs used in describing the first embodiment and detailed description of each of the elements will be omitted as appropriate. Although a case where the diaphragm 36 is formed of the single crystal silicon base, of which the crystal plane is the (100) plane, is given as an example in the first embodiment, a case where the diaphragm 36 is formed of a single crystal silicon base, of which the crystal plane is a (110) plane (crystal plane orientation perpendicular to the crystal plane is [110]), will be given as an example in the second embodiment.

Figure 10:
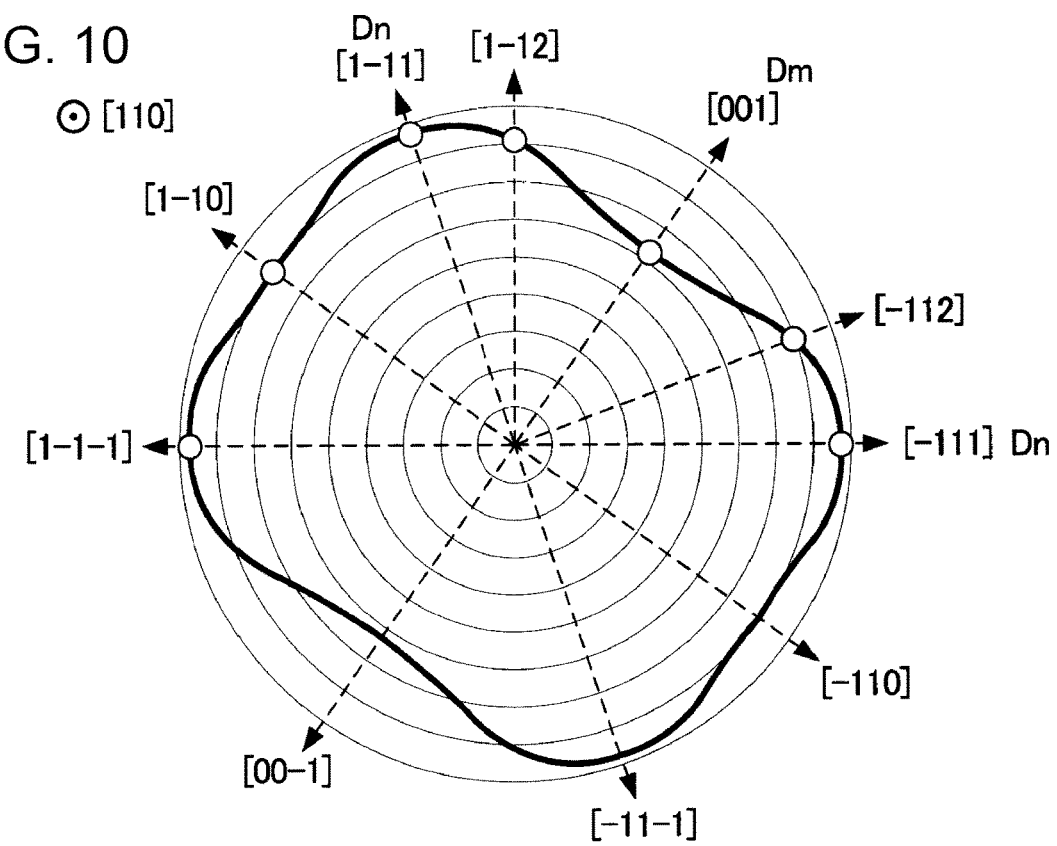
FIG. 10 is a graph showing an example of the anisotropy of the Young's modulus of the single crystal silicon base in a (110) plane.

FIG. 10 is a graph showing an example of anisotropy of a Young's modulus in the (110) plane of the single crystal silicon base of which the crystal plane is the (110) plane. FIG. 10 is expressed in polar coordinates, and a Young's modulus becomes higher as a distance from the center becomes longer in FIG. 10. As shown in FIG. 10, the Young's modulus in the (110) plane of the single crystal silicon base has substantially rectangular anisotropy. In FIG. 10, in the (110) plane, for example, a Young's modulus is minimum in the crystal orientation [001], and for example, a Young's modulus is a maximum value in a crystal orientation [1-11] of 55 degrees counterclockwise from the crystal orientation [001].

Therefore, when an orientation in which a Young's modulus is a minimum value is set as Dm and an orientation in which a Young's modulus is a maximum value is set as Dn, the diaphragm 36 is more unlikely to be displaced in the orientations Dn in which a Young's modulus is high than in the orientation Dm in which a Young's modulus is low in a case where the diaphragm 36 is configured of such a silicon base. Therefore, also in a case where the diaphragm 36 is manufactured of a single crystal silicon base of which the crystal plane is the (110) plane, there are orientations in which a Young's modulus varies on the periphery of the diaphragm 36 according to a direction. Thus, there is a possibility that the displacement of the diaphragm 36 is inhibited as a whole, or a crack is likely to be generated when the pressure chambers C and the piezoelectric elements 37 are configured in shapes without considering a crystal orientation.

Also in the second embodiment, the shape of the inner edge 37A of the piezoelectric element 37 and the shape of the inner periphery 345 of the pressure chamber C are made as shapes according to a Young's modulus of the diaphragm 36, which varies according to a crystal orientation. Accordingly, a strain that occurs in the vibration region P of the diaphragm 36, which overlaps the inner periphery 345 of the pressure chamber C in plan view, can be uniformized in the peripheral direction. Therefore, the entire diaphragm 36 is likely to be displaced, and thus the displacement efficiency of the diaphragm 36 can be improved.

Also in the case of the second embodiment, by the inner edge 37A of the piezoelectric element 37 having a shape that satisfies the relationship of Equation (5), the shape of the inner edge 37A of the piezoelectric element 37 and the shape of the inner periphery 345 of the pressure chamber C can have shapes according to a Young's modulus of the diaphragm 36, which varies according to a crystal orientation, as in the first embodiment. Accordingly, strains of the inner peripheral portions 372a of the piezoelectric elements 37 can be uniformized in the peripheral direction of the vibration region P. By making the shape of the inner periphery 345 of the pressure chamber C (the shape of the vibration region P) similar to the shape of the inner edge 37A of the piezoelectric element 37 as illustrated in the plan view of FIG. 4, a strain of the diaphragm 36 can also be uniformized in the peripheral direction of the vibration region P.

According to the configuration, since an excessive deflection of the diaphragm 36 in an orientation in which a Young's modulus is low can be suppressed, the generation of a crack in the diaphragm 36 or the piezoelectric elements 37 can be suppressed, as in the second embodiment. On the other hand, since the diaphragm is likely to deflect in an orientation in which a Young's modulus is high, the inhibition of displacement of the entire diaphragm 36 can be suppressed. Therefore, displacement efficiency can be improved while the generation of a crack is suppressed.

However, since the anisotropy of the Young's modulus in FIG. 10 is different from the anisotropy of the Young's modulus in FIG. 6, the shapes of the pressure chambers C and the piezoelectric elements 37 of the second embodiment are also different from the shapes of the first embodiment. Accordingly, strains of the inner peripheral portions 372a of the piezoelectric elements 37 can be uniformized in the peripheral direction of the vibration region P.

Figure 11:
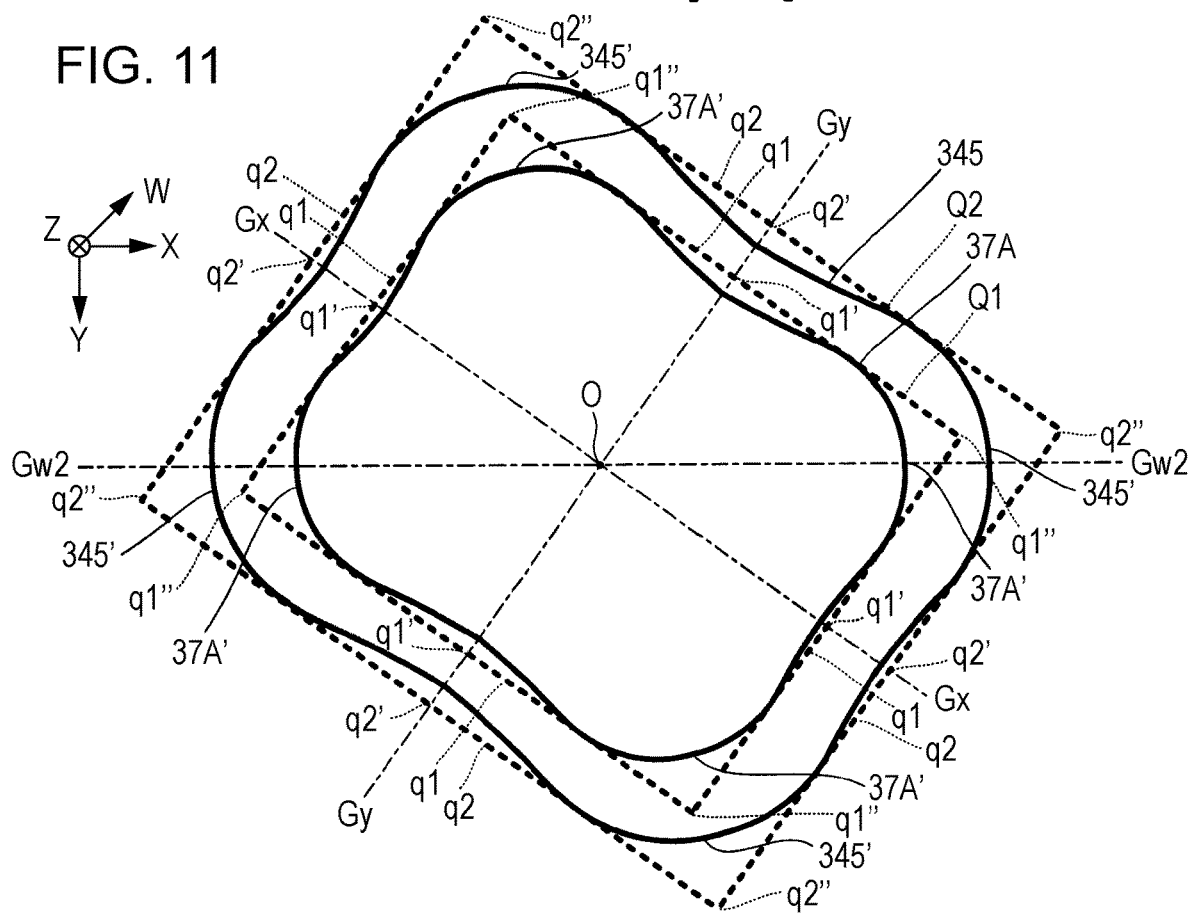
FIG. 11 is a view of an enlarged shape of an inner edge of a piezoelectric element according to a second embodiment.

Hereinafter, the shapes of the inner edges 37A of the piezoelectric elements 37 and the shapes of the inner peripheries 345 of the pressure chambers C of the second embodiment will be described. FIG. 11 is a view of the enlarged shape of the inner edge 37A of the piezoelectric element 37 according to the second embodiment, and corresponds to FIG. 7. FIG. 11 is a view in which the shape of the inner edge 37A of the piezoelectric element 37 is a shape that satisfies the relationship of Equation (5) in a case where the outer surface of the diaphragm 36 is configured of the crystal plane (110) of the single crystal silicon base. The shape of the inner edge 37A of the piezoelectric element 37 of FIG. 11 almost matches the anisotropy of the Young's modulus of FIG. 10.

For example, the shape of the inner edge 37A of the piezoelectric element 37 of FIG. 11 is such that in the smallest first rectangle Q1 (herein, a rectangle), which includes the inner edge 37A of the piezoelectric element 37 in plan view, the inner edge 37A is on the inside of a middle portion q1' of each side q1 out of the four sides q1 of the first rectangle Q1. In addition, the shape of the inner periphery 345 of the pressure chamber C is such that in the smallest second rectangle Q2 (herein, a rectangle), which includes the inner periphery 345 of the pressure chamber C in plan view, the inner periphery 345 is on the inside of a middle portion q2' of each side q2 out of the four sides q2 of the second rectangle Q2. The middle portions q1' and q2' are portions of the sides q1 and q2, which overlap the axis Gx in the direction along the axis Gx, and are portions of the sides q1 and q2, which overlap the axis Gy in the direction along the axis Gy. Orientations of the middle portions q1' and q2' (the direction of the axis Gx and the direction of the axis Gy) match the crystal Orientations Dm in which a Young's modulus is a minimum value. The direction of one side out of the first rectangle Q1 and the second rectangle Q2 (direction of the axis Gx) lies along the crystal orientation [−110] in a crystal plane.

According to such a shape, since the widths of the pressure chambers C (the widths of the vibration regions P) and the widths of the piezoelectric elements 37 can be made smaller in the crystal orientations Dm in which a Young's modulus is a minimum value, a crack in the diaphragm 36 is unlikely to be generated. On the other hand, since the widths of the pressure chambers C (the widths of the vibration regions P) and the widths of the piezoelectric elements 37 can be made larger in the crystal orientations Dn in which a Young's modulus is a maximum value than in the crystal orientations Dm in which a Young's modulus is a minimum value, the vibration regions P are likely to deflect and thus the displacement efficiency of the entire diaphragm 36 can be improved.

Since the shape of the inner edge 37A of the piezoelectric element 37 and the shape of the inner periphery 345 of the pressure chamber C are similar to each other in plan view, the width (width that overlaps the pressure chamber C in plan view) Ta from the inner periphery 345 of the pressure chamber C to the inner edge 37A of the piezoelectric element 37, which is included in the width T of the piezoelectric element 37 in the peripheral direction of the vibration region P, can be made constant. Accordingly, since an even strain is likely to occur in the entire diaphragm 36, the displacement efficiency of the entire diaphragm 36 can be improved.

In addition, the shape of the inner edge 37A of the piezoelectric element 37 is such that four corners 37A' of the inner edge 37A are on the inside of four corners q1" of the first rectangle Q1, and the shape of the inner periphery 345 of the pressure chamber C is such that four corners 345' of the inner periphery 345 are on the inside of four corners q2" of the second rectangle Q2. According to this, the widths of the piezoelectric elements 37 and the widths of the pressure chambers C can be made so as not to be excessively large in portions (four corners of the graph of the Young's modulus in FIG. 6) corresponding to the orientations Dn in which a Young's modulus is high. Accordingly, since an excessive deflection of the diaphragm 36 can be suppressed in the orientations Dn of the four corners, the generation of a crack in the diaphragm 36 or the piezoelectric elements 37 can be restricted. Each of the four corners 37A' of the piezoelectric element 37 and the four corners 345' of the pressure chamber C is curved. According to this configuration, a change in a strain in the vicinity of the orientations of the four corners 37A' of the piezoelectric element 37 and the four corners 345' of the pressure chamber C can be eased.

However, the shapes of the pressure chambers C and the piezoelectric elements 37 may be shapes close to the shape that satisfies Equation (5) without being limited to the shape (optimal shape) that satisfies Equation (5). In the embodiment, a silicon wafer formed of a single crystal silicon base of which the crystal plane is the (110) plane is used to form the diaphragm 36, for example, such that the direction of the axis Gx of the vibration region P is aligned with the crystal orientation [−110] in the crystal plane. The diaphragm is cut out from the silicon wafer. At this time, a certain degree of margin (for example, approximately ±35 degrees) can be ensured for a plane orientation offset angle of a silicon wafer to be used by ensuring a certain degree of margin also in the shapes of the pressure chambers C and the piezoelectric elements 37. Herein, an angle (clockwise angle) from the crystal orientation [−110] toward a crystal orientation [−11-1] in FIG. 10 will be set as negative (−) and an angle (counterclockwise angle) from the crystal orientation [−110] toward the crystal orientation [−111] will be set as positive (+).

Specifically, a distance between the inner edge 37A of the piezoelectric element 37 and the side q1 of the first rectangle Q1 in the first direction is 0.79 times or more to 1 time or less with respect to a distance between the inner edge 37A of the piezoelectric element 37 and a side of the first rectangle Q1 in the second direction orthogonal to the first direction, in the middle portion q1' of each side q1 of the first rectangle Q1 illustrated in FIG. 11. In addition, a distance between the inner periphery 345 of the pressure chamber C and the side q2 of the second rectangle Q2 in the first direction is 0.79 times or more to 1 time or less with respect to a distance between the inner periphery 345 of the pressure chamber C and the side q2 of the second rectangle Q2 in the second direction orthogonal to the first direction, in the middle portion q2' of each side q2 of the second rectangle Q2. In the second embodiment, the direction along the axis Gx of FIG. 11, that is, a direction of a long side of the first rectangle Q1 or the second rectangle Q2, corresponds to the first direction, and the direction along the axis Gy, that is, a direction of a short side of the first rectangle Q1 or the second rectangle Q2, corresponds to the second direction.

In the second embodiment, in a case where a direction of one side out of the first rectangle Q1 and the second rectangle Q2 (direction along the axis Gx) lies along the crystal orientation [−110] in the crystal plane as illustrated in FIG. 11, a ratio of the short side along the axis Gy to the long side along the axis Gx of the first rectangle Q1 and the second rectangle Q2 is lower than 1. In a case where a direction of one side out of the first rectangle Q1 and the second rectangle Q2 (direction along the axis Gx) lies along the crystal orientation [−110] in the crystal plane, a suitable range of a direction of an axis Gw2 along the crystal orientation [−111] is a range of ±25 degrees with respect to the crystal orientation [−111]. The axis Gw2 is an axis along a direction where an angle of 55 degrees counterclockwise from the axis Gx is formed. It is preferable that a ratio of the short side to the long side of the first rectangle Q1 and the second rectangle Q2 approach 1 as an angle between the direction of one side out of the first rectangle Q1 and the second rectangle Q2 (direction along the axis Gx) and the crystal orientation [−110] in the crystal plane becomes larger.

Figure 12:
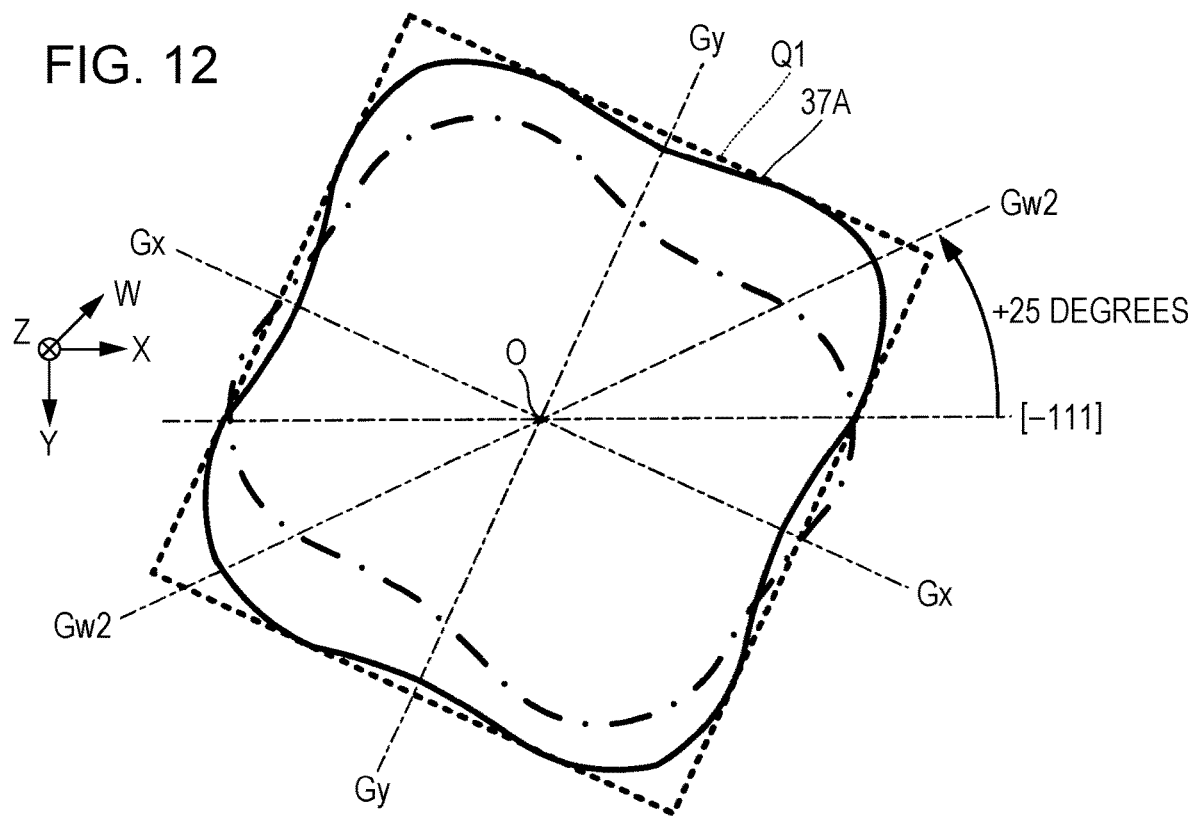
FIG. 12 is a plan view illustrating a shape of an inner edge of a piezoelectric element according to a first modification example of the second embodiment.

The shape of the inner edge 37A of the piezoelectric element 37, for example, in a case where the axis Gw2 is at +25 degrees with respect to the crystal orientation [−111] in the crystal plane is described in a first modification example of the second embodiment illustrated in FIG. 12. A ratio of the short side to the long side of the first rectangle Q1 and the second rectangle Q2 is closer to 1 (close to a square) in the shape of FIG. 12 than in the shape of FIG. 11 (shape shown with a one dot chain line of FIG. 12). In addition, the shape of the inner edge 37A of the piezoelectric element 37, for example, in a case where the axis Gw2 is at −25 degrees with respect to the crystal orientation [−111] in the crystal plane is described in a second modification example of the second embodiment illustrated in FIG. 13. A ratio of the short side to the long side of the first rectangle Q1 and the second rectangle Q2 is closer to 1 (close to a square) in the shape of FIG. 13 than in the shape of FIG. 11 (shape shown with a one dot chain line of FIG. 13).

Figure 13:
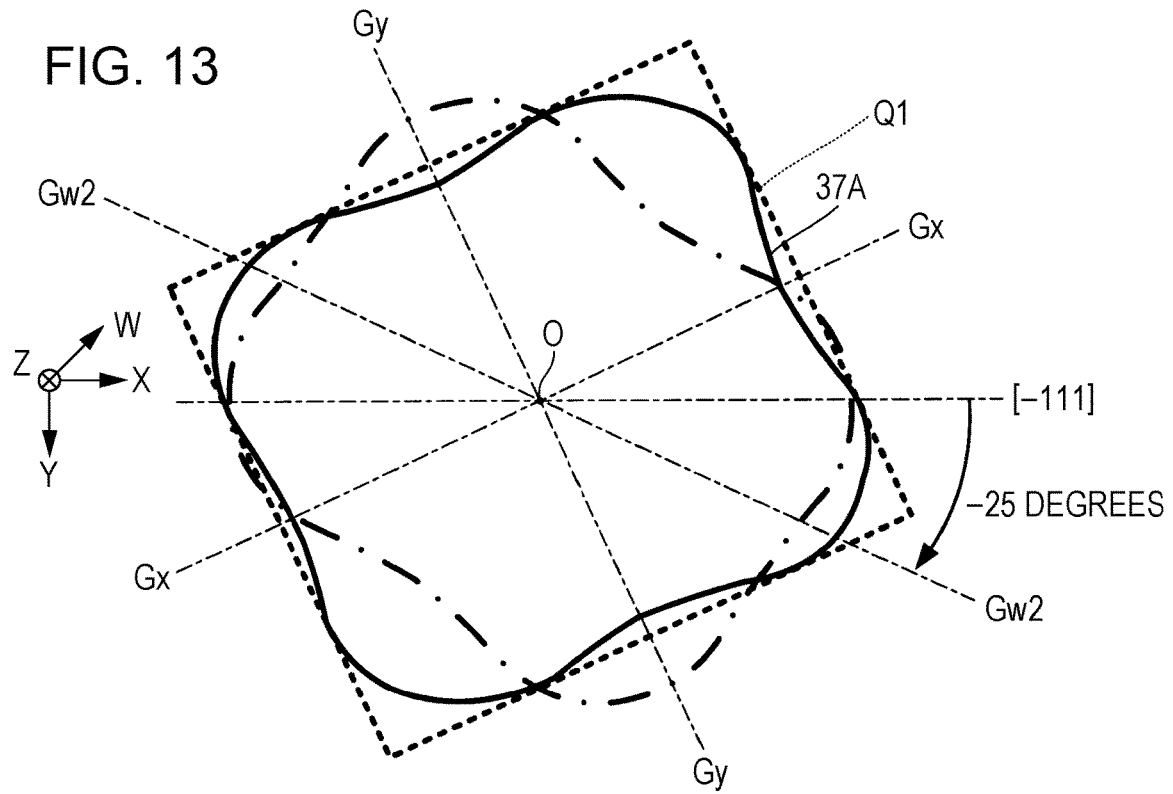
FIG. 13 is a plan view illustrating a shape of an inner edge of a piezoelectric element according to a second modification example of the second embodiment.

Herein, a ratio of the short side to the long side of the first rectangle Q1 and the second rectangle Q2 can be calculated as a ratio of a distance (distance in the direction of the axis Gy) between the inner edge 37A of the piezoelectric element 37, which is on the inside of the middle portion q1' of the short side out of the sides q1, and the center O to a distance (distance in the direction of the axis Gx) between the inner edge 37A of the piezoelectric element 37, which is on the inside of the middle portion q1' of the long side out of the sides q1, and the center O. When calculating the ratio in such a manner, it is best that a ratio of the short side to the long side is 0.694 in a case where the axis Gw2 runs in the crystal orientation [−111] in the crystal plane as illustrated in FIG. 11. It is preferable that a ratio of the short side to the long side be 0.880 in a case where the axis Gw2 is at +25 degrees with respect to the crystal orientation [−111] in the crystal plane as illustrated in FIG. 12. In addition, it is preferable that a ratio of the short side to the long side be 0.914 in a case where the axis Gw2 is at −25 degrees with respect to the crystal orientation [−111] in the crystal plane as illustrated in FIG. 13. Although a case where a ratio of the short side to the long side is calculated using the inner edge 37A of the piezoelectric element 37 is given as an example, the ratio may be calculated using the first rectangle Q1 and the second rectangle Q2 without being limited thereto. For example, a ratio of a length (length of the short side) in the axis Gy direction to a length in the direction of the axis Gx (length of the long side) may also be set as a ratio of the short side to the long side.

According to such a configuration, a margin of approximately ±35 degrees (for example, a range where the (110) substrate is not referred to as the (111) substrate) can be ensured for a plane orientation offset angle of a silicon base to be used. Even in this range, displacement efficiency can be improved while the generation of a crack in the diaphragm 36 or the piezoelectric elements 37 is suppressed. Although the shape of the inner edge 37A of the piezoelectric element 37 is given as an example in FIGS. 12 and 13, the same applies to the shape of the inner periphery 345 of the pressure chamber C.

Although a case where the crystal plane (110) of the single crystal silicon base is the outer surface (top surface) of the diaphragm 36 has been described in the embodiment, the configuration of the embodiment is applicable also to a case where a (011) plane or a (101) plane, which is a crystal plane equivalent to the crystal plane (110), is the outer surface (top surface) of the diaphragm 36 since single crystal silicon has a cubic crystal system. Even when the crystal plane is the (011) plane or the (101) plane, the Young's modulus is in a shape shown in FIG. 10. However, in a case where the crystal plane is the (011) plane, crystal orientations [1-11], [1-12], [100], [21-1], [11-1], [01-1], and [-11-1] are applied by replacing the seven reference crystal orientations [-111], [-112], [001], [1-12], [1-11], [1-10], and [1-1-1] in FIG. 10, respectively. In addition, in a case where the crystal plane is the (101) plane, crystal orientations [11-1], [12-1], [010], [-121], [-1-11], [-101], and [-1-11] are applied by replacing the seven reference crystal orientations [-111], [-112], [001], [1-12], [1-11], [1-10], and [1-1-1] in FIG. 10, respectively. As described above, all of the crystal planes (110), (011), and (101) are equivalent to each other, and a plane group of the crystal planes can be altogether referred to as a crystal plane {110}. In addition, since all of crystal orientations [-111], [1-11], and [11-1] are equal to each other, a direction group of the crystal orientation [-111] and equivalents thereof can be altogether referred to as a crystal orientation <-111>. Similarly, a direction group of the crystal orientation [-110] and equivalents thereof can be altogether referred to as a crystal orientation <-110>.

Third Embodiment

A third embodiment of the invention will be described. Although a case where the shapes of the outer edges 37B of the piezoelectric elements 37 are similar to the shapes of the inner edges 37A is given as an example in the first embodiment and the second embodiment, a case where the shapes of the outer edges 37B of the piezoelectric elements 37 are similar to the shapes of the inner edges 37A will be given as an example in the third embodiment.

The width T of the piezoelectric element 37 is a width between the inner edge 37A and the outer edge 37B. For example, as illustrated in FIG. 4, the width T of the piezoelectric element 37 can be divided into a width Ta, which is a portion that overlaps the pressure chamber C described above in plan view, and a width Tb, which is a portion that overlaps the side wall 344 of the pressure chamber C in plan view. The width Ta of the piezoelectric element 37 is the width of the inner peripheral portion 372a, and the width Tb is the width of the outer peripheral portion 372b.

According to the shape of the outer edge 37B of the piezoelectric element 37, the width Tb of the portion of the piezoelectric element 37, which overlaps the side wall 344 of the pressure chamber C in plan view, can be made larger in a direction where a Young's modulus is high in a crystal plane than in a direction where a Young's modulus is low in the crystal plane. By configuring in such a manner, since a strain amount of the vibration region P of the diaphragm 36, which is close to the side wall 344 of the pressure chamber C, in the in-plane direction can be increased, the entire diaphragm 36 can be made likely to be displaced.

Figure 14:
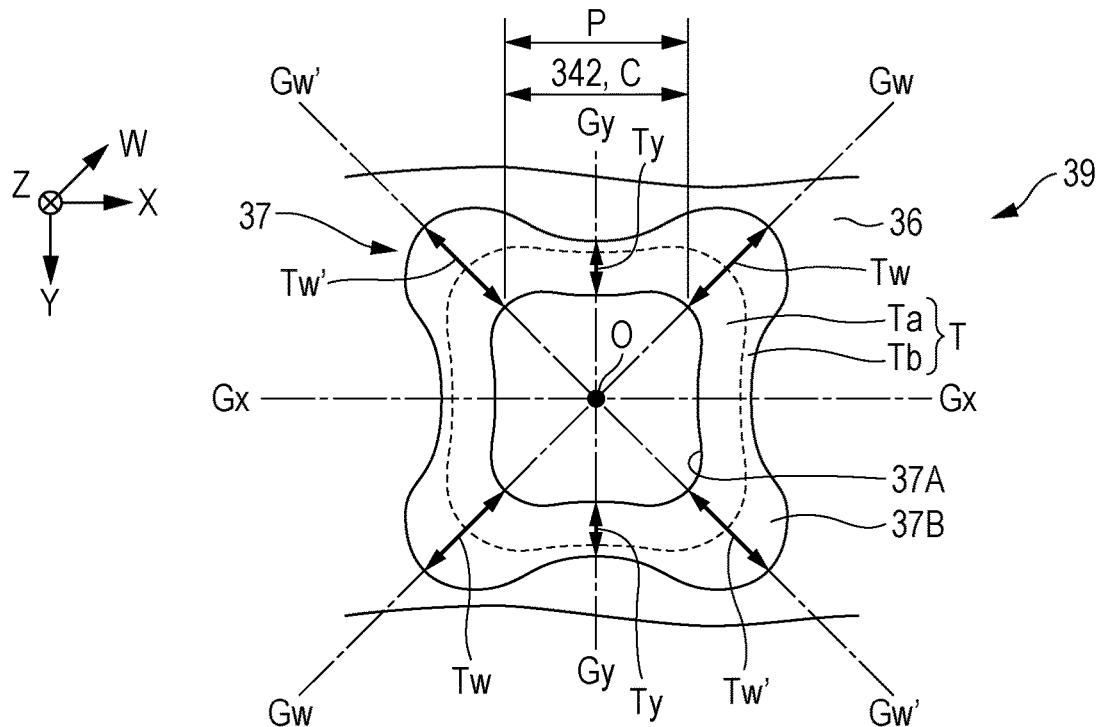
FIG. 14 is a plan view of a piezoelectric device of a third embodiment.

FIG. 14 is a plan view of the piezoelectric device 39 according to the third embodiment. FIG. 14 illustrates an example of a case (case of the first embodiment) where the shape of the outer edge 37B of the piezoelectric element 37 has changed according to a value of the Young's modulus in the crystal plane when the diaphragm 36 has the crystal plane (100) of the single crystal silicon base. According to the shape of the outer edge 37B of the piezoelectric element 37, the width Tb of a portion of the piezoelectric element 37, which overlaps the side wall 344 of the pressure chamber C in plan view, is larger in a direction where a Young's modulus is high in the crystal plane than in a direction where a Young's modulus is low. For example, the width of the piezoelectric element 37 in the orientation Dm of FIG. 6 in which a Young's modulus is a minimum value, that is, a width in the direction along the axis Gx is set as Tx, and a width in the direction along the axis Gy is set as Ty. In addition, the width of the piezoelectric element 37 in the orientation Dn of FIG. 6 in which a Young's modulus is a maximum value, that is, a width in the direction along the axis Gw1 is set as Tw, and a width in a direction along the axis Gw1' orthogonal to the axis Gw1 is set as Tw'. By the outer edge 37B of the piezoelectric element 37 having the shape illustrated in FIG. 14, the widths Tw and Tw' of the piezoelectric element 37 in the orientations Dn in which a Young's modulus is high can be made larger than the widths Tx and Ty of the piezoelectric element 37 in the orientations Dm in which a Young's modulus is low. Accordingly, since a strain amount of the vibration region P in the in-plane direction can be increased in a direction where a Young's modulus is high and deflection is unlikely to occur, the diaphragm can be made likely to be displaced also in that direction. Thus, the entire diaphragm 36 can be made likely to be displaced.

Figure 15:
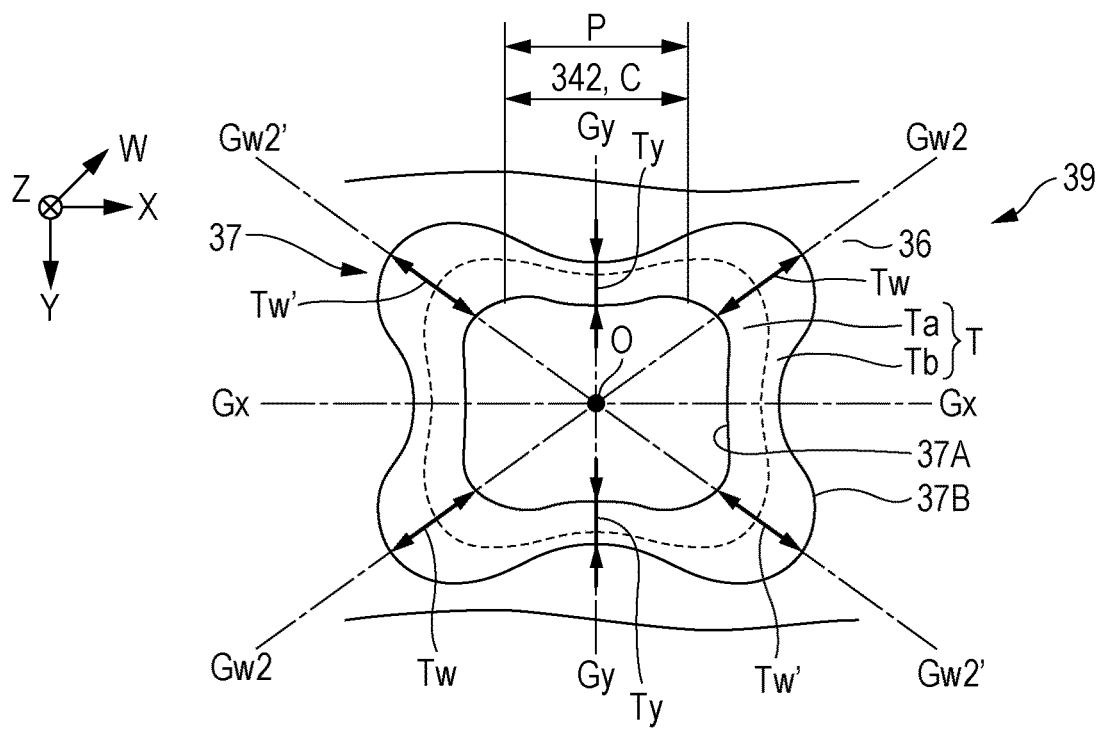
FIG. 15 is a plan view of a piezoelectric device according to a modification example of the third embodiment.

FIG. 15 is a plan view of the piezoelectric device 39 according to a modification example of the third embodiment. FIG. 15 illustrates an example of a case (case of the second embodiment) where the shape of the outer edge 37B of the piezoelectric element 37 has changed according to a value of the Young's modulus in the crystal plane when the diaphragm 36 has the crystal plane (110) of the single crystal silicon base. Also in FIG. 15, according to the shape of each of the outer edges 37B of the piezoelectric elements 37, the width Tb of a portion of the piezoelectric element 37, which overlaps the side wall 344 of the pressure chamber C in plan view, is larger in a direction where a Young's modulus is high in the crystal plane than in a direction where a Young's modulus is low in the crystal plane. For example, the width of the piezoelectric element 37 in the orientation Dm of FIG. 7 in which a Young's modulus is a minimum value, that is, a width in the direction along the axis Gx is set as Tx, and a width in the direction along the axis Gy is set as Ty. In addition, the width of the piezoelectric element 37 in the orientation Dn of FIG. 7 in which a Young's modulus is a maximum value, that is, a width in the direction along the axis Gw2 is set as Tw, and a width in a direction along the axis Gw2' is set as Tw'. The axis Gw2' is at 55 degrees clockwise from the axis Gx, and is an axis along the orientation Dn of FIG. 7 in which a Young's modulus is a maximum value. By the outer edge 37B of the piezoelectric element 37 having the shape illustrated in FIG. 15, the widths Tw and Tw' of the piezoelectric element 37 in the orientations Dn in which a Young's modulus is high can be made larger than the widths Tx and Ty of the piezoelectric element 37 in the orientations Dm in which a Young's modulus is low. Accordingly, since a strain amount of the vibration region P in the in-plane direction can be increased in a direction where a Young's modulus is high and deflection is unlikely to occur, the diaphragm can be made likely to be displaced also in that direction. Thus, the entire diaphragm 36 can be made likely to be displaced.

Fourth Embodiment

Figure 16:
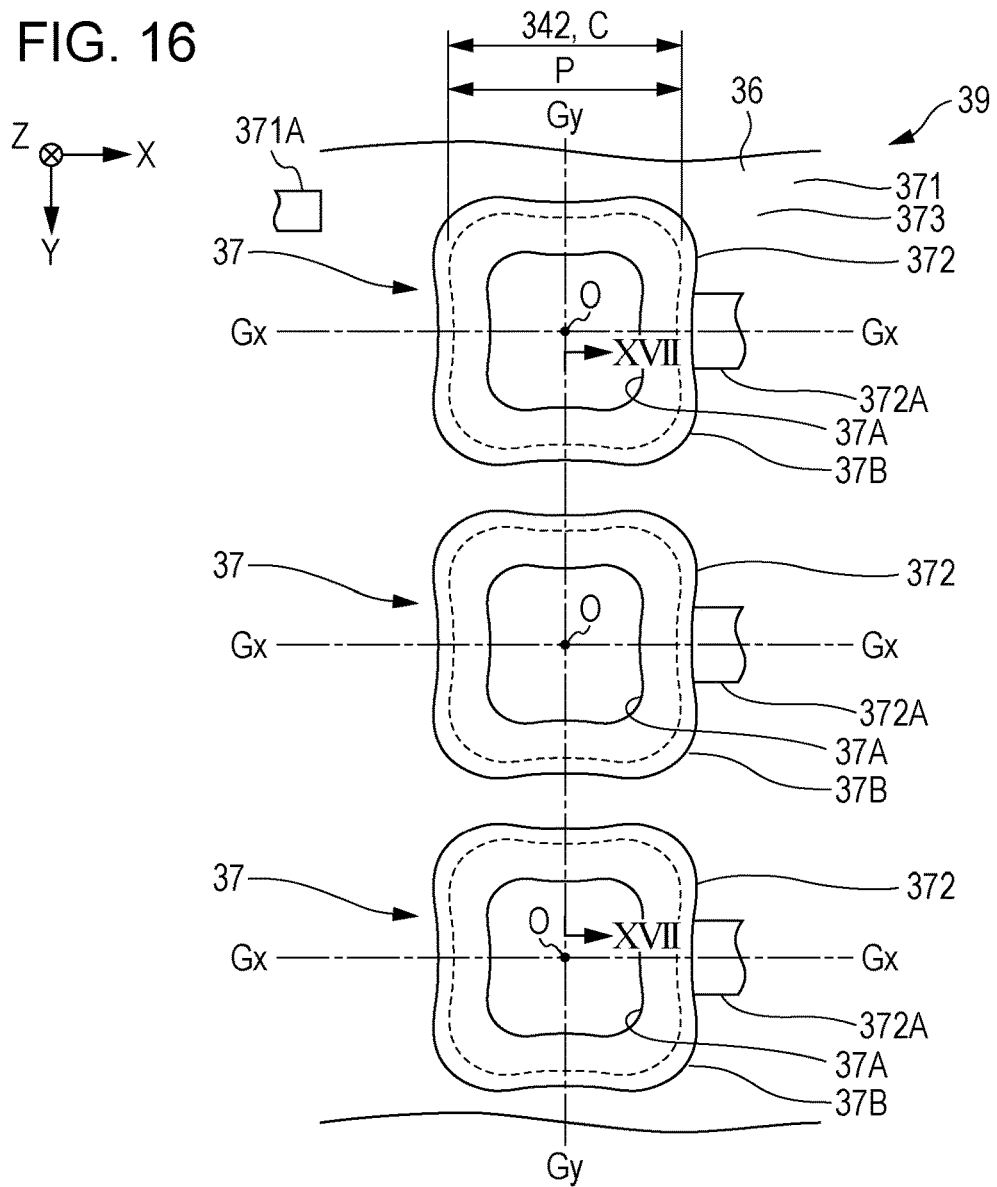
FIG. 16 is a sectional view and a plan view of the piezoelectric device.
Figure 17:
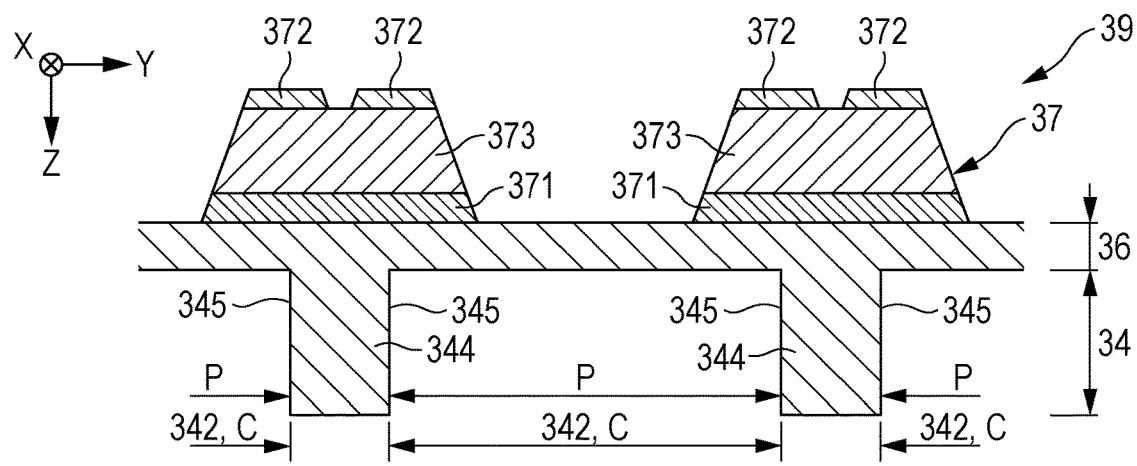
FIG. 17 is a sectional view of the piezoelectric device illustrated in FIG. 15 taken along line XVII-XVII.

A fourth embodiment of the invention will be described. A specific configuration example of the piezoelectric elements 37 of the piezoelectric device 39 according to the first embodiment will be described in the fourth embodiment. FIGS. 16 and 17 are specific configuration examples of the piezoelectric element 37 of FIG. 4. FIG. 16 is a plan view of a case where the piezoelectric device 39 according to the fourth embodiment is seen from the Z-direction. FIG. 17 is a sectional view of the piezoelectric device 39 illustrated in FIG. 16 taken along line XVII-XVII.

As illustrated in FIGS. 16 and 17, the piezoelectric element 37 of the fourth embodiment is disposed on the diaphragm 36 so as to overlap the inner periphery 345 of the pressure chamber C in plan view. The piezoelectric element has the inner edge 37A on a center O side of the pressure chamber C and has the outer edge 37B on a side wall 344 side of the pressure chamber C with the inner periphery 345 of the pressure chamber C being sandwiched between the outer edge and the inner edge in plan view.

Each of the piezoelectric elements 37 of FIG. 16 is a stacked body of which a piezoelectric layer 373 is sandwiched between a first electrode 371 and a second electrode 372, which face each other. By applying a voltage to an area between the first electrode 371 and the second electrode 372, a piezoelectric strain occurs in the piezoelectric layer 373 sandwiched between the first electrode 371 and the second electrode 372 and the piezoelectric element 37 is displaced. Therefore, in the configuration of FIG. 16, a portion where the first electrode 371, the second electrode 372, and the piezoelectric layer 373 overlap each other in plan view corresponds to each of the piezoelectric elements 37.

The first electrode 371 and the piezoelectric layer 373 illustrated in FIG. 16 are formed on the outer surface of the diaphragm 36 so as to overlap the entire perimeter of each of the inner peripheries 345 of the pressure chambers C in plan view in each of portions of the pressure chambers C. The first electrodes 371 and the piezoelectric layers 373 are not formed on the centers O of the pressure chambers C. The first electrodes 371 and the piezoelectric layers 373 are formed on the entire outer surface of the diaphragm 36 in each of the portions of the pressure chambers C. However, the first electrode 371 and the piezoelectric layer 373 may not be formed except for each of the portions of the pressure chambers C. The shapes of inner peripheries of the first electrode 371 and the piezoelectric layer 373 are squares in plan view.

Each of the first electrodes 371 is connected to the drive IC 62 via each of lead electrodes 371A pulled out to the outside of each of the piezoelectric layers 373. Each of the first electrodes 371 is a common electrode for the plurality of piezoelectric elements 37. A material that does not oxidize when forming the piezoelectric layers 373 and can maintain conductivity is preferable as a material of the first electrodes 371. For example, precious metals such as platinum (Pt) and iridium (Ir), or conductive oxides represented by lanthanum nickel oxides (LNO) are suitably used.

The piezoelectric layers 373 are made of, for example, a ferroelectric ceramic material showing electromechanical conversion action, such as a crystal film (perovskite type crystal) having a perovskite structure. The material of the piezoelectric layers 373 is not limited to the material described above. For example, in addition to a ferroelectric piezoelectric material, such as lead zirconate titanate (PZT), and a ferroelectric piezoelectric material to which a metal oxide, such as a niobium oxide, a nickel oxide, and a magnesium oxide, is added, non-lead-based piezoelectric materials that do not include lead can be used without being limited to lead-based piezoelectric materials that include lead.

The second electrode 372 is separately stacked on the first electrode 371 on a side opposite to the diaphragm 36 for each of the piezoelectric elements 37 (for each of the nozzles N) and configures a separate electrode corresponding to each of the plurality of piezoelectric elements 37. Each of the second electrodes 372 is separately connected to the drive IC 62 via each of lead electrodes 372A pulled out to the outside of each of the piezoelectric layers 373. Each of the second electrodes 372 may be directly provided on each of the piezoelectric layers 373, or other members may be sandwiched between the piezoelectric layers 373 and the second electrodes 372. A material that can form an interface between the piezoelectric layer 373 and the material well and can demonstrate insulation properties and piezoelectric properties is desirable for the second electrodes 372. For example, a precious metal material, such as iridium (Ir), platinum (Pt), palladium (Pd), and gold (Au), or conductive oxides represented by lanthanum nickel oxides (LNO) is suitably used. The second electrodes 372 may be formed by stacking a plurality of materials.

The second electrode 372 is disposed so as to overlap the entire perimeter of each of the inner peripheries 345 of the pressure chambers C in plan view. In plan view, the shapes of the inner periphery and the outer periphery of each second electrode 372 are squares. In the configuration of the embodiment, a portion from the inner periphery to the outer periphery of the second electrode 372 overlaps the first electrode 371 and the piezoelectric layer 373. Therefore, the shape of the inner periphery of the second electrode 372 corresponds to the shape of the inner edge 37A of the piezoelectric element 37, and the shape of the outer periphery of the second electrode 372 corresponds to the shape of the inner edge 37A of the piezoelectric element 37. A case where the pressure chamber substrate 34 and the diaphragm 36 are configured of separate bodies is given as an example in the first embodiment. Without being limited thereto, the pressure chamber substrate 34 and the diaphragm 36 may be integrated with each other so as to form the pressure chambers C and the diaphragm 36 at once as in the embodiment. In the configuration, by selectively removing, in accordance with a crystal orientation, a part of a region corresponding to each of the pressure chambers C in a thickness direction from a single crystal silicon base having a predetermined thickness, the pressure chambers C and the diaphragm 36 can be formed at once.

A case where in the piezoelectric elements 37 of the embodiment, the first electrodes 371 are set as common electrodes for the plurality of piezoelectric elements 37 and the second electrodes 372 are set as separate electrodes corresponding to the plurality of piezoelectric elements 37 is given as an example. Without being limited to the configuration, however, the second electrodes 372 may be set as common electrodes for the plurality of piezoelectric elements 37 and the first electrodes 371 may be set as separate electrodes corresponding to the plurality of piezoelectric elements 37. Although a case where the diaphragm 36 is configured of a single layer is given as an example in the embodiment described above, the diaphragm may be configured of a plurality of layers without being limited thereto.

According to the piezoelectric device 39 of the fourth embodiment having such a configuration, a piezoelectric strain and displacement occur in each of the piezoelectric layers 373 sandwiched between the first electrode 371 and the second electrode 372 by applying a voltage to an area between the first electrode 371 and the second electrode 372. A pressure in each of the pressure chambers C changes by the diaphragm 36 vibrating in tandem with a piezoelectric strain of the piezoelectric layer 373. Portions of the diaphragm 36, which overlap the pressure chambers C, are the vibration regions P. The outer surface of the diaphragm 36 of FIG. 16 is configured of the crystal plane of the single crystal silicon substrate of FIG. 6. Since the piezoelectric elements 37 and the pressure chambers C of FIG. 16 have the same shape as in FIG. 4, the same operational effects in FIG. 4 can be achieved. The piezoelectric elements 37 of the second embodiment can also be configured in the same manner as in the embodiment.

Modification Example

The forms and the embodiments given as examples above can be variously changed. Examples of forms of specific deformation are given as follows. Any two or more forms selected from the following examples and the forms described above can be combined as appropriate unless the selected forms are inconsistent with each other.

(1) Although a serial head that repeatedly causes the carriage 242, on which the liquid discharging heads 26 are mounted, to reciprocate in the X-direction is given as an example in the embodiments described above, the invention is also applicable to a line head in which the liquid discharging heads 26 are arranged over the entire width of the medium 12.

(2) Although the piezoelectric liquid discharging heads 26, in which the piezoelectric elements mechanically vibrating the pressure chambers are used, are given as an example in the embodiments described above, it is also possible to adopt thermal liquid discharging heads in which heating elements generating bubbles inside the pressure chambers by heating are used.

(3) The liquid discharging apparatus 10 given as an example in the embodiments described above can be adopted in various types of devices such as a facsimile device and a copier, in addition to a device exclusive to printing. The use of the liquid discharging apparatus 10 of the invention is not limited to printing. For example, a liquid discharging apparatus that discharges a color material solution is used as a manufacturing apparatus that forms a color filter of a liquid crystal display device, an organic electroluminescent (EL) display, and a field emission display (FED). A liquid discharging apparatus that discharges a conductive material solution is used as a manufacturing apparatus that forms wiring of a wiring substrate and an electrode. In addition, the liquid discharging apparatus is also used as a chip manufacturing apparatus that discharges a bioorganic solution as a type of a liquid.

What is claimed is:

1. A piezoelectric device comprising:
a pressure chamber having a sidewall;
a piezoelectric element having a substantially rectangular-shaped outer edge and a substantially rectangular-shaped inner edge, the inner edge forming a hollow center; and
a diaphragm disposed between the pressure chamber and the piezoelectric element,
wherein:
the pressure chamber is formed by the sidewall and the diaphragm,
the diaphragm has a crystal plane {100} of a single crystal silicon base,
the piezoelectric element is disposed on the diaphragm, the inner edge of the piezoelectric element overlaps the pressure chamber, and the outer edge of the piezoelectric element overlaps the sidewall of the pressure chamber,
a shape of the inner edge of the piezoelectric element is substantially same as a first rectangle, which includes the inner edge in plan view,
a shape of an inner periphery of the sidewall of the pressure chamber is substantially same as a second rectangle, which includes the inner periphery of the sidewall in plan view,
each of a width and a length of the second rectangle is greater than a respective width and length of the first rectangle, and
one side of the first rectangle and one side of the second rectangle are parallel to each other and also parallel to a crystal orientation <010> in the crystal plane.

2. The piezoelectric device according to claim 1, wherein a distance between the inner edge of the piezoelectric element and the side of the first rectangle in a first direction is 0.79 times or more and 1 time or less with respect to a distance between the inner edge of the piezoelectric element and the side of the first rectangle in a second direction orthogonal to the first direction, and
a distance between the inner periphery of the sidewall of the pressure chamber and the side of the second rectangle in the first direction is 0.79 times or more and 1 time or less with respect to a distance between the inner periphery of the pressure chamber and the side of the second rectangle in the second direction.

3. The piezoelectric device according to claim 1, wherein the shape of the inner edge of the piezoelectric element is such that four corners of the inner edge are on the inside of four corners of the first rectangle, and
the shape of the inner periphery of the sidewall of the pressure chamber is such that four corners of the inner periphery are on the inside of four corners of the second rectangle.

4. The piezoelectric device according to claim 3, wherein each of the four corners of the piezoelectric element and the four corners of the pressure chamber is curved.

5. The piezoelectric device according to claim 1, wherein the shape of the inner edge of the piezoelectric element and the shape of the inner periphery of the sidewall of the pressure chamber are similar to each other in plan view.

6. A liquid discharging head comprising:
the piezoelectric device according to claim 1,
wherein a liquid that has filled the pressure chamber is discharged from a nozzle by the piezoelectric element vibrating the diaphragm to change a pressure of the pressure chamber.

7. A liquid discharging head comprising:
the piezoelectric device according to claim 2, wherein a liquid that has filled the pressure chamber is discharged from a nozzle by the piezoelectric element vibrating the diaphragm to change a pressure of the pressure chamber.

8. A liquid discharging head comprising:
the piezoelectric device according to claim 3,
wherein a liquid that has filled the pressure chamber is discharged from a nozzle by the piezoelectric element vibrating the diaphragm to change a pressure of the pressure chamber.

9. A liquid discharging head comprising:
the piezoelectric device according to claim 4,
wherein a liquid that has filled the pressure chamber is discharged from a nozzle by the piezoelectric element vibrating the diaphragm to change a pressure of the pressure chamber.

10. A liquid discharging head comprising:
the piezoelectric device according to claim 5,
wherein a liquid that has filled the pressure chamber is discharged from a nozzle by the piezoelectric element vibrating the diaphragm to change a pressure of the pressure chamber.

11. A liquid discharging apparatus comprising:
the piezoelectric device according to claim 1,
wherein a liquid that has filled the pressure chamber is discharged from a nozzle by the piezoelectric element vibrating the diaphragm to change a pressure of the pressure chamber.

12. A liquid discharging apparatus comprising:
the piezoelectric device according to claim 2,
wherein a liquid that has filled the pressure chamber is discharged from a nozzle by the piezoelectric element vibrating the diaphragm to change a pressure of the pressure chamber.

13. A liquid discharging apparatus comprising:
the piezoelectric device according to claim 3,
wherein a liquid that has filled the pressure chamber is discharged from a nozzle by the piezoelectric element vibrating the diaphragm to change a pressure of the pressure chamber.

14. A liquid discharging apparatus comprising:
the piezoelectric device according to claim 4,
wherein a liquid that has filled the pressure chamber is discharged from a nozzle by the piezoelectric element vibrating the diaphragm to change a pressure of the pressure chamber.

15. A liquid discharging apparatus comprising:
the piezoelectric device according to claim 5,
wherein a liquid that has filled the pressure chamber is discharged from a nozzle by the piezoelectric element vibrating the diaphragm to change a pressure of the pressure chamber.

* * * * *